US009406884B2

(12) United States Patent
Chien et al.

(10) Patent No.: US 9,406,884 B2
(45) Date of Patent: Aug. 2, 2016

(54) METHOD FOR MAKING ORGANIC LIGHT EMITTING DIODE ARRAY

(71) Applicants: Tsinghua University, Beijing (CN); HON HAI PRECISION INDUSTRY CO., LTD., New Taipei (TW)

(72) Inventors: Liang-Neng Chien, Hsinchu (TW); Jung-An Cheng, Hsinchu (TW); Dong An, Beijing (CN); Zhen-Dong Zhu, Beijing (CN); Chang-Ting Lin, Hsinchu (TW); I-Wei Wu, Hsinchu (TW); Qun-Qing Li, Beijing (CN); Shou-Shan Fan, Beijing (CN)

(73) Assignees: Tsinghua University, Beijing (CN); HON HAI PRECISION INDUSTRY CO., LTD., New Taipei (TW)

( * ) Notice: Subject to any disclaimer, the term of this patent is extended or adjusted under 35 U.S.C. 154(b) by 0 days.

(21) Appl. No.: 14/316,849

(22) Filed: Jun. 27, 2014

(65) Prior Publication Data
US 2015/0179946 A1    Jun. 25, 2015

(30) Foreign Application Priority Data

Dec. 25, 2013   (CN) ............................ 2013 1 0724804

(51) Int. Cl.
*H01L 21/00* (2006.01)
*H01L 51/00* (2006.01)
*H01L 27/32* (2006.01)
*H01L 51/52* (2006.01)

(52) U.S. Cl.
CPC ........ *H01L 51/0013* (2013.01); *H01L 27/3211* (2013.01); *H01L 27/3258* (2013.01); *H01L 27/3281* (2013.01); *H01L 27/3246* (2013.01); *H01L 51/52* (2013.01); *H01L 51/5209* (2013.01); *H01L 51/5225* (2013.01); *H01L 2227/323* (2013.01); *H01L 2251/558* (2013.01)

(58) Field of Classification Search
CPC ............ H01L 51/0013; H01L 51/5088; H01L 51/0023; H01L 51/0017; H01L 51/5068; H01L 51/5072; H01L 51/5036; H01L 51/56; H01L 27/3262; H01L 27/3211; H01L 27/3216; H01L 33/405
USPC ................................................ 438/29, 34, 35
See application file for complete search history.

(56) References Cited

U.S. PATENT DOCUMENTS

| | | | |
|---|---|---|---|
| 2005/0001546 A1* | 1/2005 | Yamaguchi | 313/512 |
| 2013/0187132 A1* | 7/2013 | Ando et al. | 257/40 |

* cited by examiner

*Primary Examiner* — Calvin Choi
(74) *Attorney, Agent, or Firm* — ScienBiziP, P.C.

(57) ABSTRACT

The disclosure relates to a method of making organic light emitting diode array. A base defining a plurality of convexities is provided. A number of first electrodes are applied on the plurality of convexities. A patterned second insulative layer is made among the convexities to cover first parts of the first electrodes between the convexities and expose second parts of the first electrodes on top surfaces of the convexities to form a number of protrudent portions. A number of electroluminescent layers are transfer printed on the number of protrudent portions to form a number of organic light emitting layers. A second electrode is electrically connected to the number of organic light emitting layers.

20 Claims, 30 Drawing Sheets

METHOD FOR MAKING ORGANIC LIGHT EMITTING DIODE ARRAY

CROSS-REFERENCE TO RELATED APPLICATIONS

This application claims priority to Chinese Patent Application No. 201310724055.2 filed on Dec. 25, 2013 in the China Intellectual Property Office, the contents of which are incorporated by reference herein.

FIELD

The subject matter herein generally relates to organic light emitting diode (OLED) arrays and method for making the same.

BACKGROUND

Organic light emitting diodes are a type of light emitting diode that is made of thin films of organic molecules. A display screen using the organic light emitting diodes need no back light source, can save electric energy, and has greater angle of visibility. Thus, the organic light emitting diodes attract more and more attention.

A conventional method for making the organic light emitting diodes is to make a plurality of organic light emitting diodes on a substrate to form an array. The method includes: forming a thin-film transistor (TFT) array on the substrate; applying a first insulative layer on the thin-film transistor array; forming a plurality of first electrodes on the first insulative layer; applying a second insulative layer on the first insulative layer to cover the edges of each of plurality of first electrodes to expose the middle portion of each of plurality of first electrodes; depositing an organic light emitting layer on the middle portion of each of plurality of first electrodes; and making a second electrode on the organic light emitting layer. However, the organic light emitting layer is formed usually by vacuum evaporation which needs mask, high temperature, and vacuum device. Thus, the method is complicated and high cost.

What is needed, therefore, is to provide an organic light emitting diode arrays and method for making the same which can overcome the shortcomings as described above.

BRIEF DESCRIPTION OF THE DRAWINGS

Implementations of the present technology will now be described, by way of example only, with reference to the attached figures, wherein.

DETAILED DESCRIPTION

Figure 1:
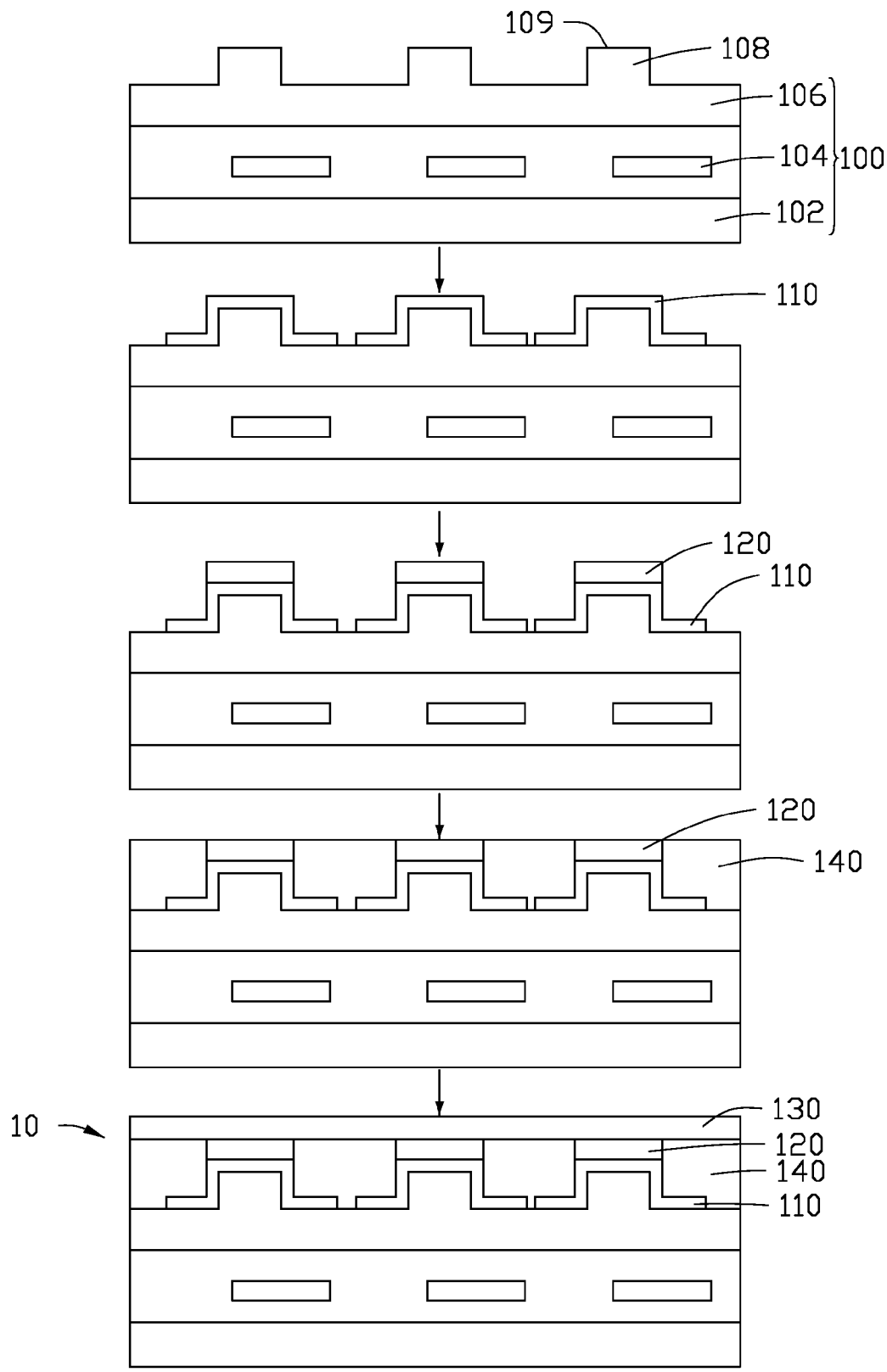
FIG. 1 is a flow chart of one embodiment of a method for making an organic light emitting diode array.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. The drawings are not necessarily to scale and the proportions of certain parts may be exaggerated to better illustrate details and features. The description is not to be considered as limiting the scope of the embodiments described herein.

Several definitions that apply throughout this disclosure will now be presented.

The term "coupled" is defined as connected, whether directly or indirectly through intervening components, and is not necessarily limited to physical connections. The connection can be such that the objects are permanently connected or releasably connected. The term "outside" refers to a region that is beyond the outermost confines of a physical object. The term "inside" indicates that at least a portion of a region is partially contained within a boundary formed by the object. The term "substantially" is defined to be essentially conforming to the particular dimension, shape or other word that substantially modifies, such that the component need not be exact. For example, substantially cylindrical means that the object resembles a cylinder, but can have one or more deviations from a true cylinder. The term "comprising" means "including, but not necessarily limited to"; it specifically indicates open-ended inclusion or membership in a so-described combination, group, series and the like. It should be noted that references to "an" or "one" embodiment in this disclosure are not necessarily to the same embodiment, and such references mean at least one.

The present disclosure is described in relation to organic light emitting diode arrays and methods for making the same. The organic light emitting diode array includes a base having a plurality of convexities, and a plurality of organic light emitting diodes located on the plurality of convexities. Each of the plurality of organic light emitting diodes can include a hole injection layer (HIL), a hole transport layer (HTL), an electroluminescent layer (EL), an electron transport layer (ETL), and an electron injection layer (EIL) stacked with each other in that order. The hole injection layer, the hole transport layer, the electron transport layer, and the electron injection layer are optional. The plurality of organic light emitting diodes can share a common hole injection layer, hole transport layer, electron transport layer, and/or the electron injection layer. The organic light emitting diode array can be an active matrix type or passive matrix type. The number of the organic light emitting diodes in each organic light emitting diode array is not limited. Each of the plurality of organic light emitting diodes can be used as a pixel unit. Each of the plurality of organic light emitting diodes can also be used as a sub-pixel, and three of the plurality of organic light emitting diodes form a pixel unit.

The plurality of organic light emitting diodes can be made on the plurality of convexities by transfer printing. In some embodiments, at least one of the hole injection layer, the hole transport layer, the electroluminescent layer, the electron transport layer, and the electron injection layer can be made by transfer printing. Especially, the hole injection layer, the hole transport layer, the electroluminescent layer are made by transfer printing, and the electron transport layer and the electron injection layer are made by vacuum evaporation because the wetting process may change the property of the electron injection layer. The material for transfer printing is coated on a template first and then transfer printed from the template to the plurality of convexities to form a plurality of layer-shaped elements. The material for transfer printing can be transfer printed to form a plurality of layer-shaped elements with the same or different thickness or heights. The plurality of layer-shaped elements can be transfer printed on all of the plurality of convexities once time, twice time, or more than twice time.

FIG. 1 illustrates a method of one embodiment for making an organic light emitting diode array 10. The method includes following steps:

step (S10), providing a base 100, wherein the base 100 includes a substrate 102, a plurality of thin-film transistors 104 located on a surface of the substrate 102 and arranged to form an array, and a first insulative layer 106 located on a surface of the plurality of thin-film transistors 104; the first insulative layer 106 defines a plurality of convexities 108 on a surface opposite to the plurality of thin-film transistors 104;

step (S11), forming a plurality of first electrodes 110 on the plurality of convexities 108, wherein each of the plurality of first electrodes 110 is located on and electrically connected to one of the plurality of thin-film transistors 104;

step (S12), applying a plurality of organic light emitting layers 120 on the plurality of first electrodes 110;

step (S13), making a patterned second insulative layer 140 to cover the plurality of first electrodes 110 and expose part of each of the plurality of organic light emitting layers 120; and step (S14), electrically connecting a second electrode 130 to the plurality of organic light emitting layers 120.

In step (S10), the material of the substrate 102 can be glass, ceramic, silicon dioxide ($SiO_2$), silicon nitride (SiN) or polymer. The plurality of thin-film transistors 104 can be made of semiconductor such as silicon, gallium arsenide (GaAs), gallium nitride (GaN), or carbon nanotubes (CNTs). In one embodiment, the substrate 102 is a silicon dioxide layer on a wafer, and the plurality of thin-film transistors 104 are made on the wafer similar to that used to make semiconductor device.

The first insulative layer 106 covers all of the plurality of thin-film transistors 104. The first insulative layer 106 can be configured to provide a smooth surface for making the plurality of organic light emitting diodes and insulate the plurality of organic light emitting diodes from the plurality of thin-film transistors 104. The first insulative layer 106 can be made of organic insulative material or inorganic insulative material. The thickness of the first insulative layer 106 can be in a range from about 1 micrometer to about 50 micrometers. In one embodiment, the thickness of the first insulative layer 106 is in a range from about 1 micrometer to about 15 micrometers. The first insulative layer 106 can be made by depositing, transfer printing or spin coating.

Figure 2:
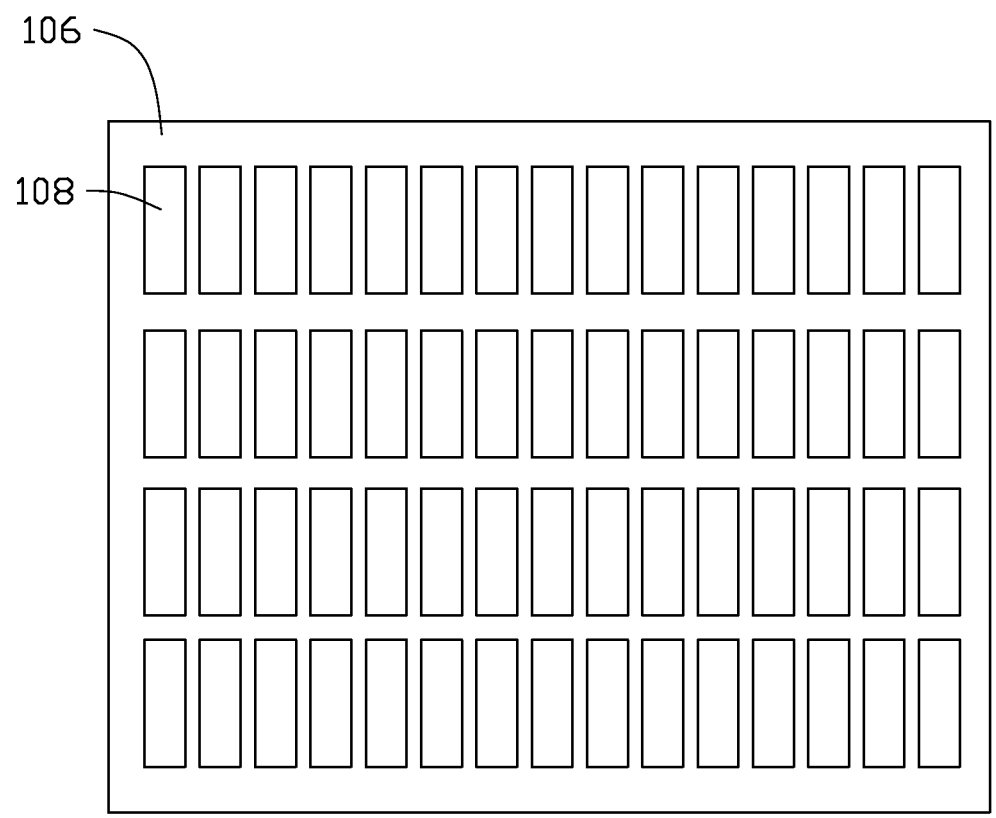
FIG. 2 is a schematic view of one embodiment of a plurality of convexities arranged in a two-dimensional array.
Figure 3:
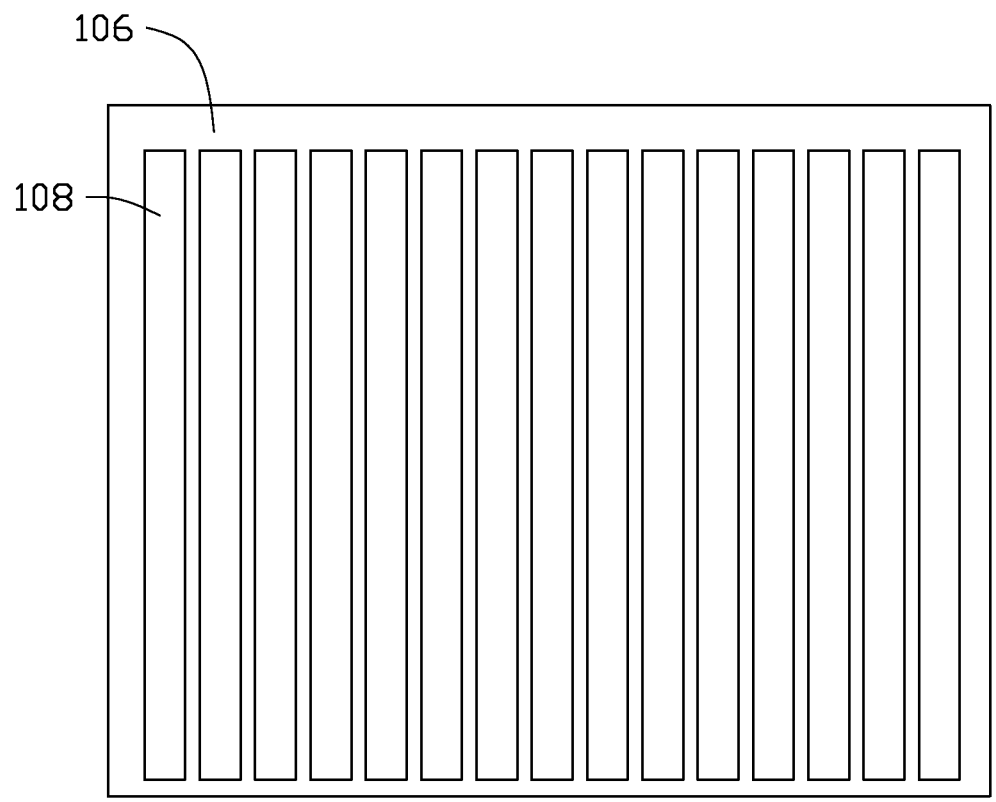
FIG. 3 is a schematic view of one embodiment of a plurality of strip-shaped convexities arranged in a one-dimensional array.

The plurality of convexities 108 can be arranged in a two-dimensional array as shown in FIG. 2. The shape of the convexity 108 can be selected according to need, as long as the convexity 108 has a smooth top surface 109. Each of the plurality of convexities 108 can be a frustum of a cone, a cuboid, or a cube, namely, the smooth top surface 109 can be circular, square, or rectangular. The smooth top surface 109 can be a planar surface or a curved surface such as concave spherical or convex spherical. When the smooth top surface 109 is a curved surface, the organic light emitting layer 120 can have a greater area, and the angle of the emergent light of the organic light emitting layer 120 can be adjusted by changing the curvature of the smooth top surface 109. The size of the convexity 108 can be selected according to pixel unit of the organic light emitting diode array 10, for example, from tens micrometers to hundreds micrometers. The plurality of convexities 108 can be made by printing, etching, or stamping. When the first insulative layer 106 is made of organic insulative material, the plurality of convexities 108 can be made by stamping. When the first insulative layer 106 is made of inorganic insulative material, the plurality of convexities 108 can be made by etching. The plurality of convexities 108 can also be arranged in a one-dimensional array as shown in FIG. 3. Each of the plurality of convexities 108 is strip-shaped, and the plurality of convexities 108 are in parallel with each other. In one embodiment, the plurality of convexities 108 are a plurality of cuboids arranged in a two-dimensional array, and the plurality of convexities 108 are located corresponding to the plurality of thin-film transistors 104 in a one-to-one manner.

In step (S11), the plurality of first electrodes 110 are paced and insulated from each other. The plurality of first electrodes 110 are electrical conductive layers and made of conductive oxide, such as indium tin oxide (ITO), indium zinc oxide (IZO), aluminum zinc oxide (AZO), zinc oxide (ZnO) or tin oxide (TO), or metal such as gold, silver, aluminum, magnesium or alloy thereof. Each of the plurality of first electrodes 110 is located at least on the smooth top surface 109 of the corresponding convexity 108. In one embodiment, each of the plurality of first electrodes 110 is coated on both the smooth top surface 109 and side surfaces of the corresponding convexity 108. The plurality of first electrodes 110 can be formed by directly depositing through a mask. The plurality of first electrodes 110 can also be formed by depositing a continuous conductive layer to cover all the plurality of convexities 108 first, and then patterning the continuous conductive layer by etching to obtain the plurality of first electrodes 110. At least part of each of the plurality of first electrodes 110 is located on the smooth top surface 109 of the corresponding convexity 108 so that each first electrode 110 has a protrudent surface. The protrudent surface can be used to transfer print the plurality of organic light emitting layers 120.

Figure 4:
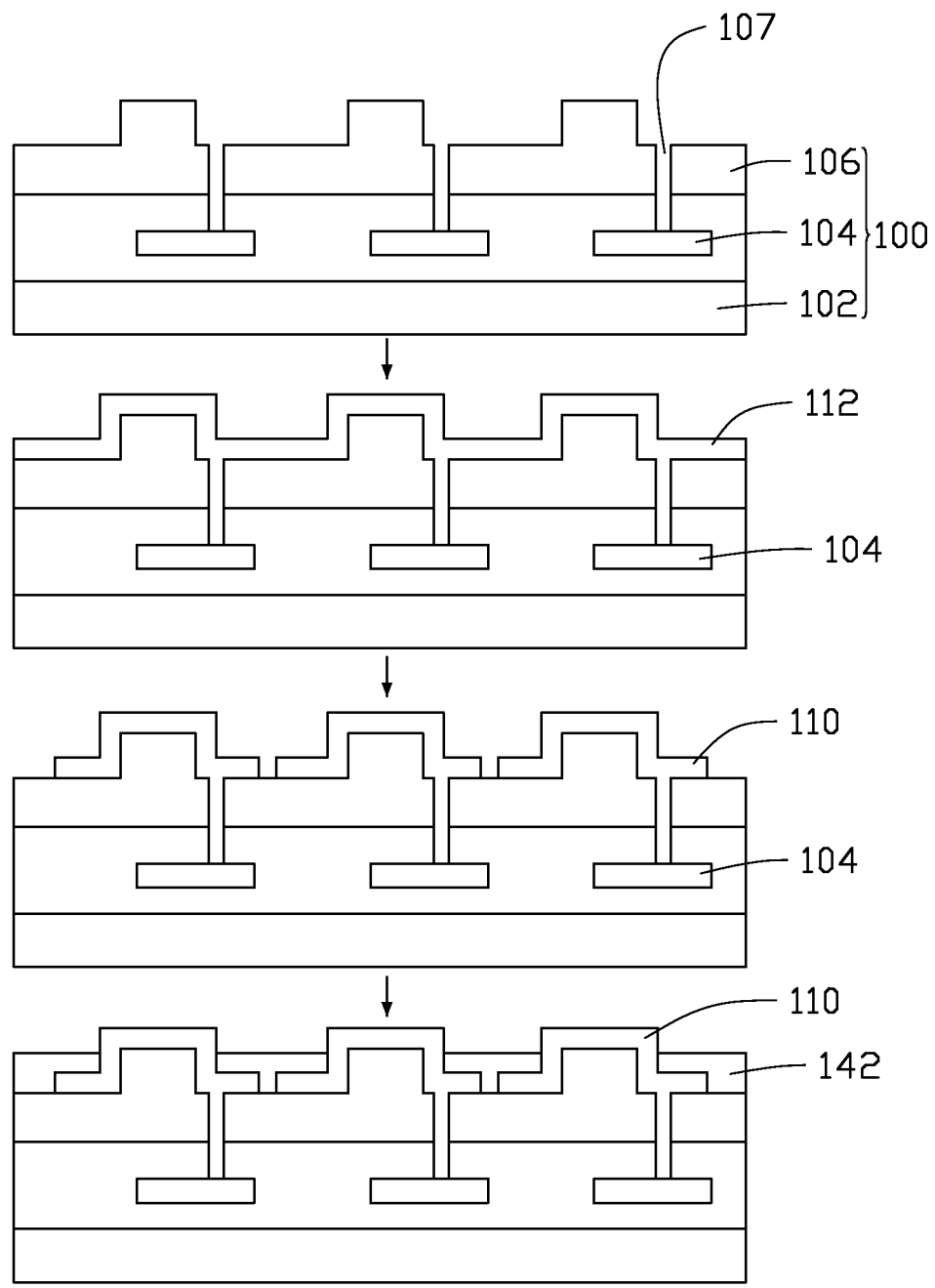
FIG. 4 is a flow chart of one embodiment of a method for making a first electrode of an organic light emitting diode array.

FIG. 4 illustrates a method of one embodiment for making the plurality of first electrodes 110. The method includes following steps:

step (S110), exposing part of each of the plurality of thin-film transistors 104 by etching the base 100 from the first insulative layer 106;

step (S111), depositing a continuous conductive layer 112 to cover all the plurality of convexities 108 and electrically connect to the plurality of thin-film transistors 104;

step (S112), patterning the continuous conductive layer 112 to obtain the plurality of first electrodes 110 spaced from each other, wherein each of the plurality of first electrodes 110 corresponds to and is electrically connected to one of the plurality of thin-film transistors 104; and step (S113), making a patterned third insulative layer 142 between the plurality of first electrodes 110 so that adjacent two of the plurality of first electrodes 110 are insulated from each other and the part of the plurality of first electrodes 110 on the smooth top surfaces 109 are exposed.

In step (S110), the etching method can be selected according to the material of the first insulative layer 106 and the thin-film transistors 104. A plurality of openings 107 are formed to corresponding the plurality of thin-film transistors 104 so that at least part of each of the plurality of thin-film transistors 104 is exposed.

In step (S111), the method for depositing the conductive layer 112 can be selected according to need, for example, sputtering, chemical vapor deposition, or thermal deposition. The conductive layer 112 can be deposited in to the plurality of openings 107 to electrically connect to the plurality of thin-film transistors 104. In one embodiment, the depositing the conductive layer 112 includes: depositing a first indium tin oxide layer; applying a silver layer on the first indium tin oxide layer; and depositing a second indium tin oxide layer on the silver layer. Thus, an ITO/Ag/ITO composite conductive layer 112 is formed. Because the silver metal layer is sandwiched between two indium tin oxide layers, the metal layer can prevent oxidation.

In step (S112), the patterning the continuous conductive layer 112 can be performed by etching through a mask. The pattern of the plurality of first electrodes 110 can be designed according to need.

In step (S113), the patterned third insulative layer 142 can be formed by directly depositing through a mask. The patterned third insulative layer 142 can be formed by depositing a continuous insulative layer to cover the plurality of first electrodes 110 and then removing part of the continuous insulative layer to expose the part of the plurality of first electrodes 110 on the smooth top surfaces 109. When the conductive layer 112 is ITO/Ag/ITO composite, the metal layer will be exposed on edge during patterning the conductive layer 112. The patterned third insulative layer 142 can cover the edge of the plurality of first electrodes 110 to protect the exposed metal layer of the ITO/Ag/ITO composite. The patterned third insulative layer 142 can also prevent the plurality of first electrodes 110 from being broken or electrically connected with each other in following process. The step (S113) is optional.

Figure 5:
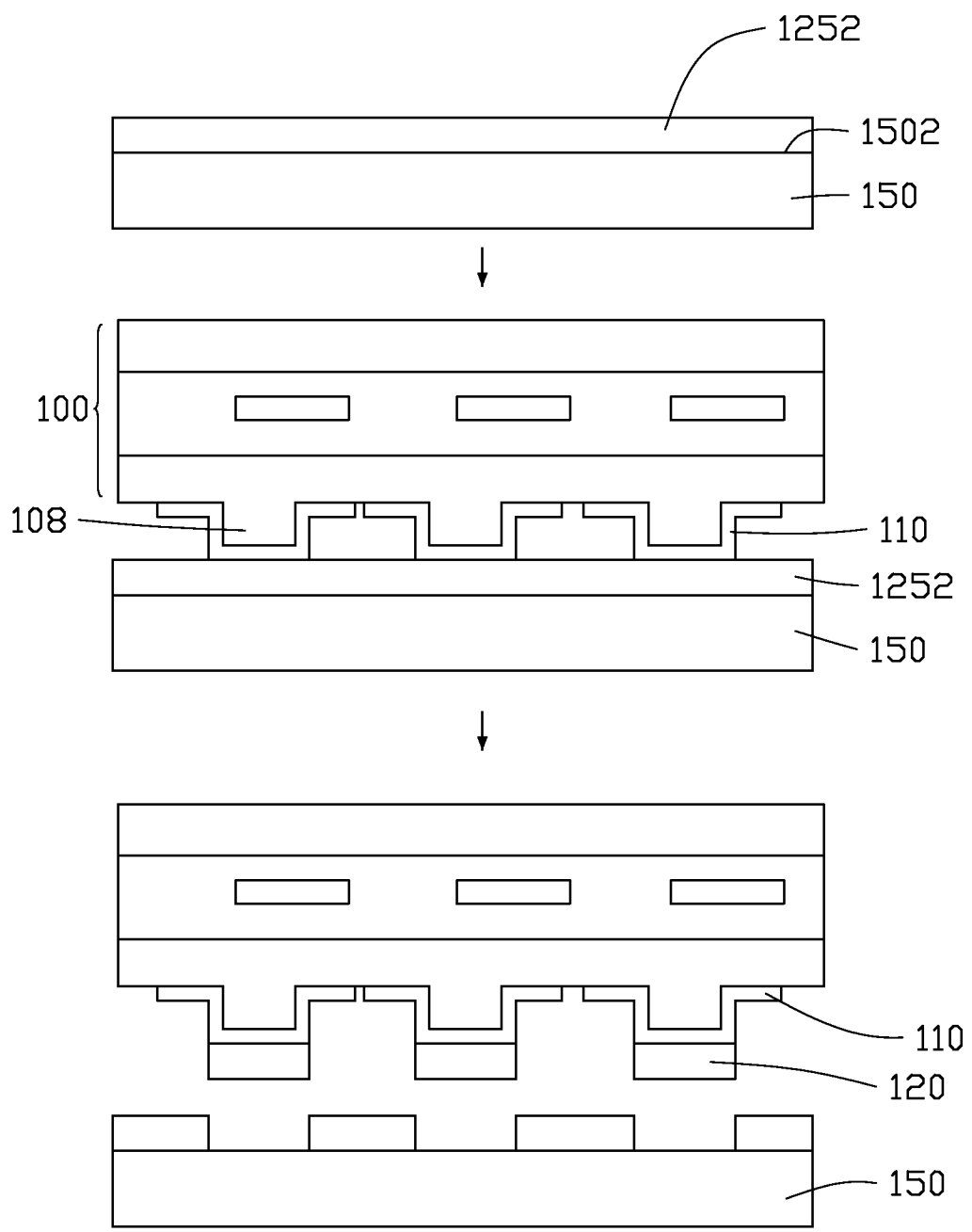
FIG. 5 is a flow chart of one embodiment of a method for making an organic light emitting layer of an organic light emitting diode array.

In step (S12), the plurality of organic light emitting layers 120 are made my transfer printing. In one embodiment, as shown in FIG. 5, each of the plurality of organic light emitting layers 120 only includes an electroluminescent layer 125. The plurality of organic light emitting layers 120 are made by following steps:

step (S120), applying an organic electroluminescent film 1252 on a surface 1502 of a first template 150;

step (S121), contacting the protrudent surfaces of the plurality of first electrodes 110 with the organic electroluminescent film 1252; and step (S122), separating the plurality of first electrodes 110 from the first template 150.

In step (S120), the material, size and shape of the first template 150 can be selected or designed according to need. The material of the organic electroluminescent film 1252 can be any organic electroluminescent high or low molecular materials that can be made in to solution, such as polyfluorene (PF). The thickness of the organic electroluminescent film 1252 can be in a range from about tens nanometers to about hundreds nanometers, for example, from about 50 nanometers to about 300 nanometers. The organic electroluminescent film 1252 can be applied on the surface 1502 of the first template 150 by spin-coating, spray-coating, brush-coating, or immerse-coating. In one embodiment, the first template 150 is a planar polydimethylsiloxane (PDMS) substrate with low surface free energy, and the organic electroluminescent film 1252 is coated on the entire surface 1502.

Furthermore, a wetting layer (not shown) can be applied on the surface 1502 of the first template 150 before applying the organic electroluminescent film 1252. Thus, the organic electroluminescent film 1252 is easy to be coated and transferred. The wetting layer can be a high volatile solvent coated on the surface 1502, such as toluene. The wetting layer can also be a plurality of high reactive functional groups formed by treating the surface 1502. For example, a plurality of carboxyl group (—COOH) or hydroxyl group (—OH) can be formed on the surface 1502 of the polydimethylsiloxane first template 150 by oxygen plasma treating.

In step (S121), a pressure can be applied on the base 100 in the process of contacting the protrudent surfaces of the plurality of first electrodes 110 with the organic electroluminescent film 1252. Because the plurality of first electrodes 110 are located on the plurality of convexities 108 and the organic electroluminescent film 1252 is formed on the planar surface 1502, it is easy to transfer print and does not need to align the plurality of first electrodes 110 with the organic electroluminescent film 1252.

In step (S122), a plurality of electroluminescent layers 125 are formed on the protrudent surfaces of the plurality of first electrodes 110 and used as the plurality of organic light emitting layers 120.

Furthermore, a heating can be applied on the first template 150 in the process of separating the plurality of first electrodes 110 from the first template 150. Thus, the plurality of first electrodes 110 and the first template 150 may have different temperature, and the adhesion strength between the organic electroluminescent film 1252 and the plurality of first electrodes 110 is stronger than the adhesion strength between the organic electroluminescent film 1252 and the first template 150.

Because the plurality of electroluminescent layers 125 have the same material, the organic light emitting diode array 10 is a monochromatic organic light emitting diode array. Each of the plurality of organic light emitting layer 120 can be a single layer of organic electroluminescent material that can luminesce red light, green light, blue light, or white light. Each of the plurality of organic light emitting layer 120 can also be a multi-layer structure of different organic electroluminescent materials that can be made by repeating embodiment of the method of FIG. 5. For example, each of the plurality of organic light emitting layer 120 includes red light electroluminescent layer, a green light electroluminescent layer, and a blue light electroluminescent layer stacked with each other.

Furthermore, a hole injection layer 122 and a hole transport layer 124 can be formed on the plurality of first electrodes 110 before the transfer printing the plurality of electroluminescent layers 125. Also, an electron transport layer 126 and an electron injection layer 128 can be formed on surfaces of the plurality of electroluminescent layers 125 after the transfer printing the plurality of electroluminescent layers 125. The hole injection layer 122, the hole transport layer 124, the electron transport layer 126, and the electron injection layer 128 can be made by the transfer printing method of FIG. 5, or by the vacuum evaporation. The material of the hole injection layer 122 suitable for transfer printing can be PEDOT:PSS. The PEDOT:PSS is a water solution of a polymer consisting of PEDOT and PSS. The PEDOT is Poly(3,4-ethylenedioxythiophene). The PSS is poly(styrenesulfonate). The material of the hole transport layer 124 suitable for transfer printing can be polyaniline (PAN).

When the hole injection layer 122, the hole transport layer 124, the electron transport layer 126, and the electron injection layer 128 are made by the vacuum evaporation, the hole injection layer 122, each of the hole transport layer 124, the electron transport layer 126, and the electron injection layer 128 can be a continuous layer. Namely, the plurality of organic light emitting layers 120 have a common hole injection layer 122, a common hole transport layer 124, a common electron transport layer 126, and a common electron injection layer 128. When the hole injection layer 122, the hole transport layer 124, the electron transport layer 126, and the electron injection layer 128 are made by the transfer printing method of FIG. 5, each of the hole transport layer 124, the electron transport layer 126, and the electron injection layer 128 is a patterned structure with a plurality of layers spaced from each other. Namely, each of the plurality of organic light emitting layers 120 has an independent hole injection layer 122, an independent hole transport layer 124, an independent electron transport layer 126, and an independent electron injection layer 128.

In step (S13), the patterned second insulative layer 140 can be formed by directly depositing through a mask. The patterned second insulative layer 140 can also be formed by depositing a continuous insulative layer to cover the plurality of first electrodes 110 and the plurality of organic light emitting layers 120, and then removing the part of the continuous insulative layer to expose a part of each of the plurality of organic light emitting layers 120. The patterned second insulative layer 140 can be made of the same or different material as the first insulative layer 106. The patterned second insulative layer 140 can insulate adjacent two of the plurality of first electrodes 110 and prevent the plurality of first electrodes 110 from being electrically connected with the second electrode 130 in following process. Because the plurality of first electrodes 110 are covered by the plurality of organic light emitting layers 120, the patterned second insulative layer 140 only need to be coated on the first electrode 110 between adjacent two of the plurality of convexities 108 or on the side surfaces of the plurality of convexities 108. In one embodiment, the patterned second insulative layer 140 and the plurality of organic light emitting layers 120 have a common planar surface so that the second electrode 130 is easy to be formed.

In step (S14), the second electrode 130 is an electrical conductive layer and made of conductive oxide, such as indium tin oxide, indium zinc oxide, aluminum zinc oxide, zinc oxide or tin oxide, or metal such as gold, silver, aluminum, magnesium or alloys thereof. The second electrode 130 can be a continuous conductive layer, namely, the organic light emitting diode array 10 shares a common second electrode. The second electrode 130 can also be a patterned structure, namely, a plurality of second electrodes 130 are located. Each of the plurality of second electrodes 130 is located corresponding to a single one of the plurality of organic light emitting layers 120 or one row of the plurality of organic light emitting layers 120. The second electrode 130 can be formed by sputtering, vacuum evaporation, transfer printing, or spin coating to cover all of the patterned second insulative layer 140 and the plurality of organic light emitting layers 120. The second electrode 130 can also be formed on the corresponding one of the plurality of organic light emitting layers 120 by screen printing or mask depositing. In one embodiment, the second electrode 130 is a continuous indium tin oxide film with a thickness of about 100 micrometers.

Furthermore, a step of applying an insulative protecting layer on the second electrode 130 to package the organic light emitting diode array 10 can be performed.

Figure 6:
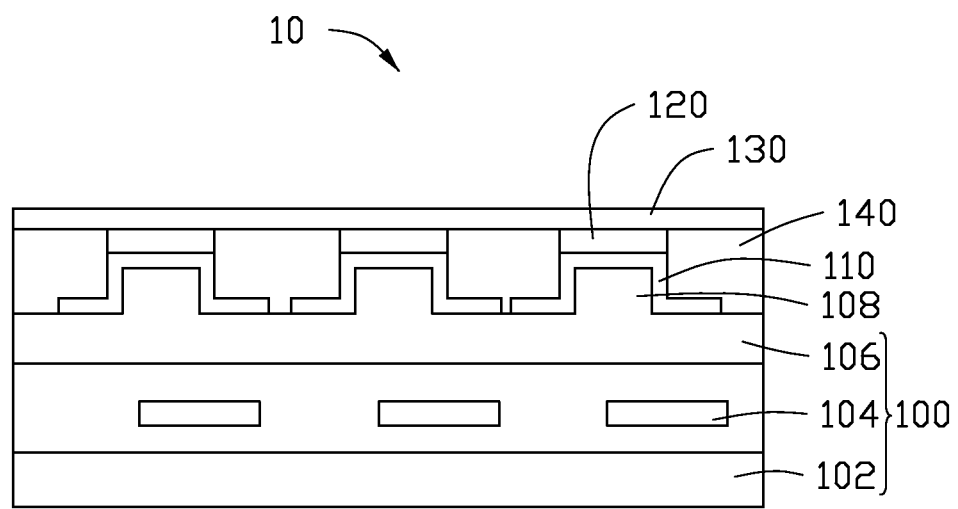
FIG. 6 is a schematic view of one embodiment of an organic light emitting diode array.

FIG. 6 illustrates an organic light emitting diode array 10 of one embodiment. The organic light emitting diode array 10 includes a base 100, a plurality of first electrodes 110, a plurality of organic light emitting layers 120, a patterned second insulative layer 140, and a second electrode 130. The base 100 includes a substrate 102, a plurality of thin-film transistors 104 located on a surface of the substrate 102 and arranged to form an array, and a first insulative layer 106 located on a surface of the plurality of thin-film transistors 104. The first insulative layer 106 defines a plurality of convexities 108 on a surface opposite to the plurality of thin-film transistors 104. The plurality of first electrodes 110 and the plurality of thin-film transistors 104 are located and electrically connected with each other in a one-to-one manner. Each of the plurality of first electrodes 110 is located on the top surface and side surfaces of the corresponding one of the plurality of convexities 108. Part of the plurality of first electrodes 110 extend to the surface of the first insulative layer 106 exposed from adjacent two of the plurality of convexities 108. The plurality of organic light emitting layers 120 are located on the surfaces of the plurality of first electrodes 110 and electrically connected with the plurality of first electrodes 110 in a one-to-one manner. The patterned second insulative layer 140 cover the plurality of first electrodes 110 and expose the plurality of organic light emitting layers 120. The second electrode 130 covers the patterned second insulative layer 140 and the plurality of organic light emitting layers 120.

Figure 7:
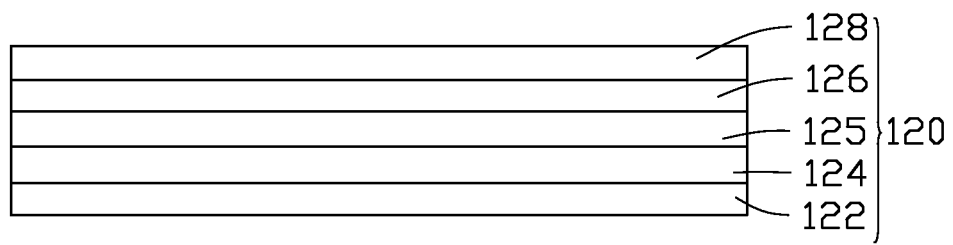
FIG. 7 is a schematic view of one embodiment of an organic light emitting layer.

Referring to FIG. 7, each of the plurality of organic light emitting layers 120 can include a hole injection layer 122, a hole transport layer 124, an electroluminescent layer 125, an electron transport layer 126, and an electron injection layer 128. The hole injection layer 122, the hole transport layer 124, the electroluminescent layer 125, the electron transport layer 126, and the electron injection layer 128 are stacked with each other in that order from the first electrode 110 to the second electrode 130 or from the second electrode 130 to the first electrode 110. Each of the hole injection layer 122, the hole transport layer 124, the electron transport layer 126, and the electron injection layer 128 can be located only corresponding to one of the plurality of first electrodes 110. Each of the hole injection layer 122, the hole transport layer 124, the electron transport layer 126, and the electron injection layer 128 can also be a continuous layer to cover all of the plurality of first electrodes 110.

The organic light emitting diode array 10 is a monochromatic organic light emitting diode array. Embodiments of full color organic light emitting diode array are provided below. Only one pixel unit is shown in the FIGS. Each of the pixel unit includes a red light organic light emitting diode, a green light organic light emitting diode, and a blue light organic light emitting diode. The red light organic light emitting diode, the green light organic light emitting diode, and the blue light organic light emitting diode are used as three sub-pixels.

Figure 8:
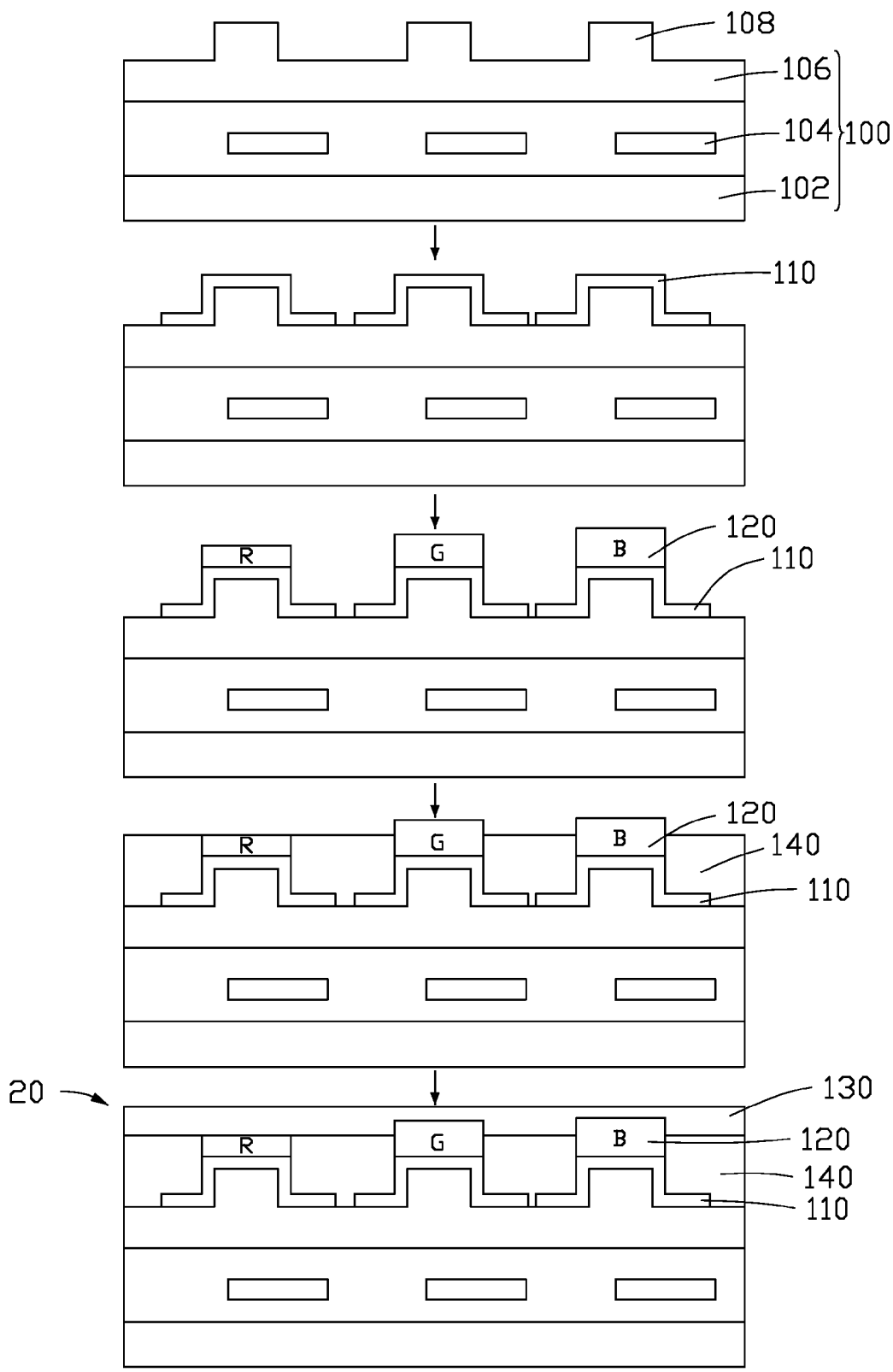
FIG. 8 is a flow chart of one embodiment of a method for making an organic light emitting diode array.

FIG. 8 illustrates a method of one embodiment for making an organic light emitting diode array 20. The method includes following steps:

step (S20), providing a base 100, wherein the base 100 includes a substrate 102, a plurality of thin-film transistors 104 located on a surface of the substrate 102 and arranged to form an array, and a first insulative layer 106 located on a surface of the plurality of thin-film transistors 104; and the first insulative layer 106 defines a plurality of convexities 108 on a surface opposite to the plurality of thin-film transistors 104;

step (S21), forming a plurality of first electrodes 110 on the plurality of convexities 108, wherein each of the plurality of first electrodes 110 is located corresponding to and electrically connected to one of the plurality of thin-film transistors 104;

step (S22), applying a plurality of organic light emitting layers 120 on the plurality of first electrodes 110, wherein adjacent three of the plurality of organic light emitting layers 120 have different organic electroluminescent materials;

step (S23), making a patterned second insulative layer 140 to cover the plurality of first electrodes 110 and expose part of each of the plurality of organic light emitting layers 120; and step (S24), electrically connecting a second electrode 130 to the plurality of organic light emitting layers 120.

The method for making the organic light emitting diode array 20 is similar to the method for making the organic light emitting diode array 10 except that in step (S22), three organic light emitting layers 120 of the same pixel unit have different organic electroluminescent materials that can luminesce light of different color. In one embodiment, a red light organic light emitting layer 120, a green light organic light emitting layer 120, and a blue light organic light emitting layer 120 are transfer printed on adjacent three of the plurality of first electrodes 110. Thus, the organic light emitting diode array 20 can achieve full color display.

In one embodiment, the red light organic light emitting layer 120, the green light organic light emitting layer 120, and the blue light organic light emitting layer 120 of the same pixel unit can have different thickness. In one embodiment, one of the red light organic light emitting layer 120, the green light organic light emitting layer 120, and the blue light organic light emitting layer 120 of the same pixel unit can have different thickness with the other two. Because the red light, green light and the blue light have different transmittance through the organic light emitting layer 120, the second electrode layer 130 and other package layer, the different thickness of the organic light emitting layers 120 allows the red light, the green light and the blue light to be mixed uniformly.

Figure 9:
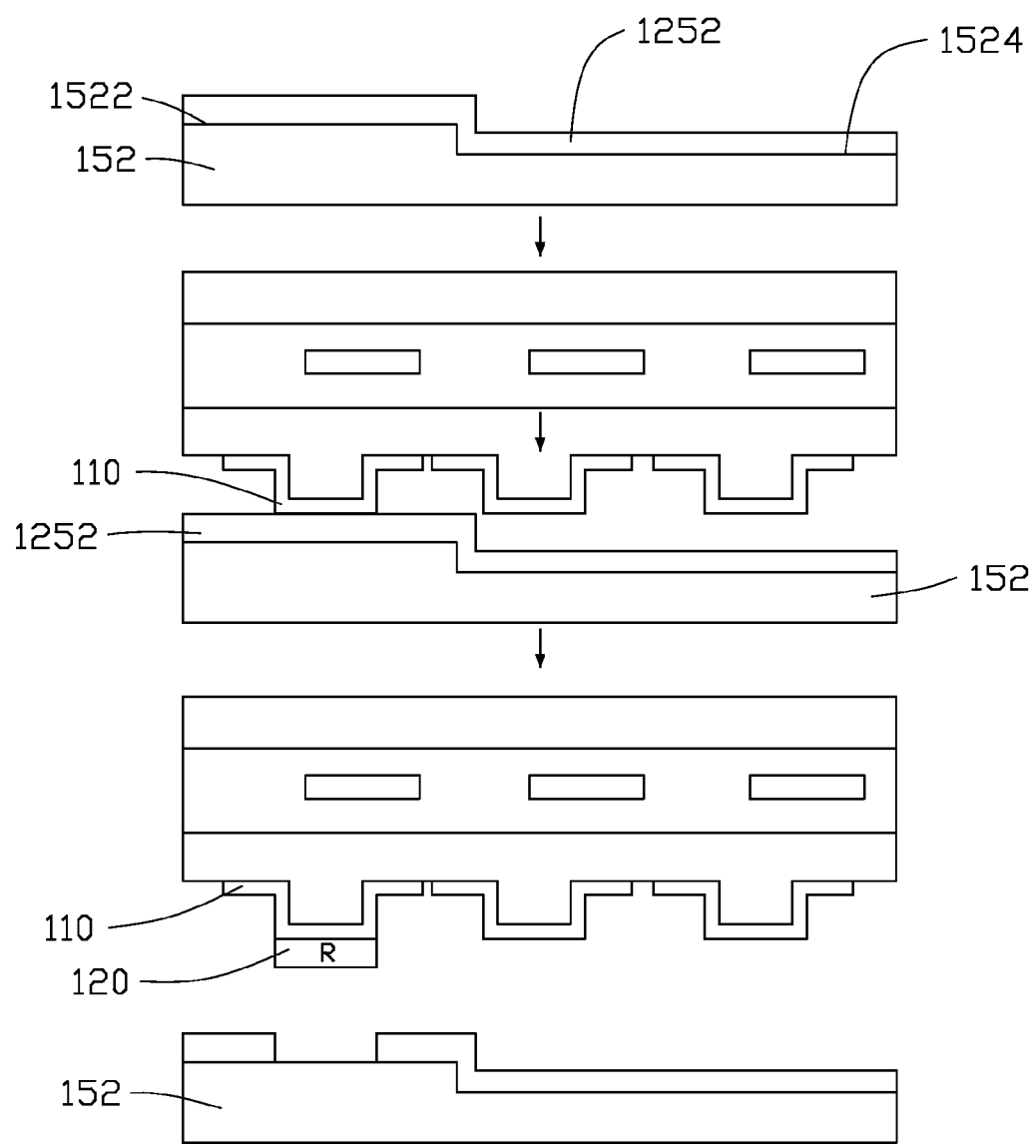
FIG. 9 is a flow chart of one embodiment of a method for making an organic red light emitting layer of an organic light emitting diode array.
Figure 10:
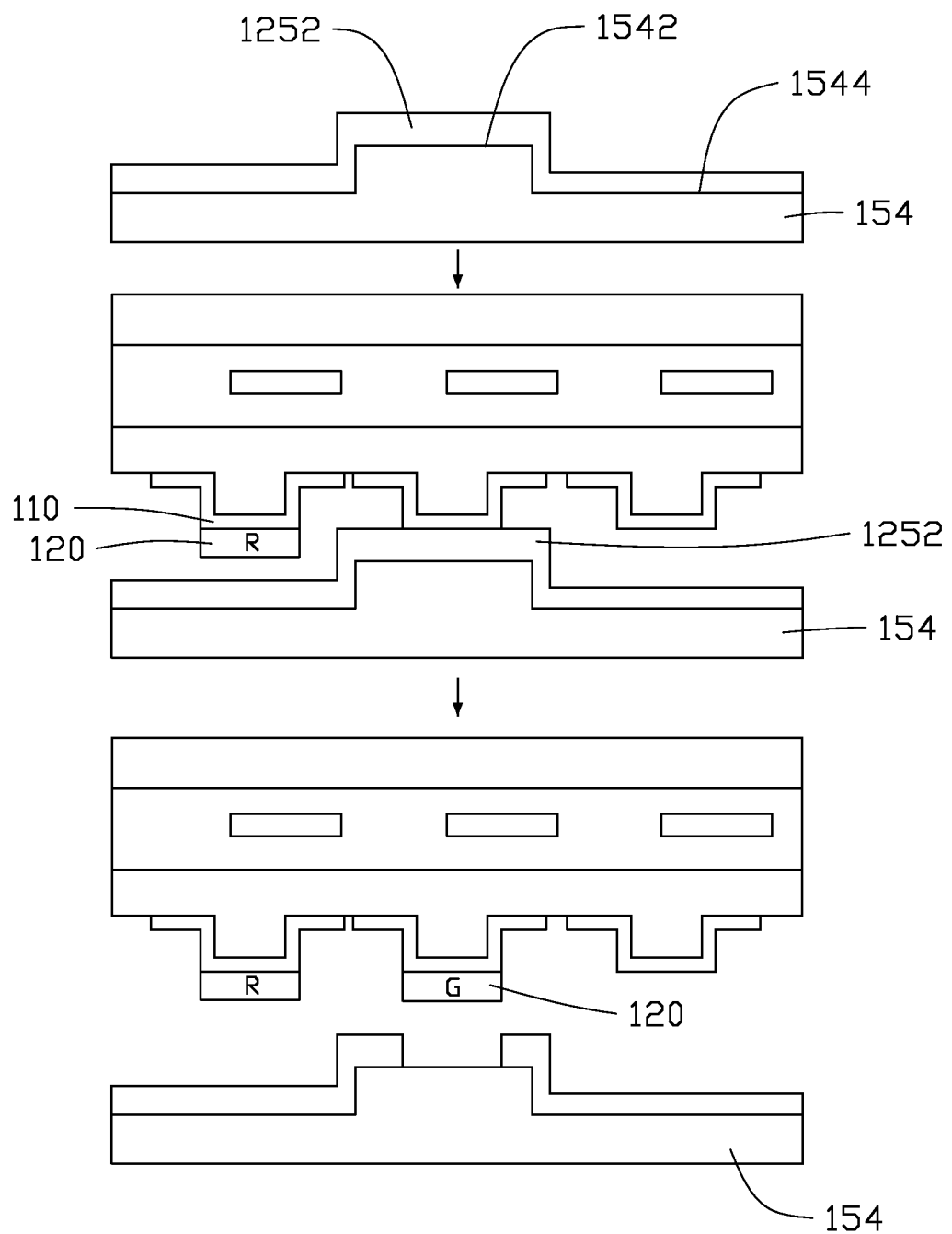
FIG. 10 is a flow chart of one embodiment of a method for making an organic green light emitting layer of an organic light emitting diode array.

FIGS. 9-10 illustrates a method of one embodiment for transfer printing three different color organic light emitting layers 120 on three adjacent first electrodes 110. The method includes following steps:

step (S220), applying a red light organic electroluminescent film 1252 on a surface of a second template 152;

step (S221), contacting the first one of the three first electrodes 110 with the red light organic electroluminescent film 1252;

step (S222), separating the first one of the three first electrodes 110 from the second template 152 so that a red light organic light emitting layer 120 is formed on the first one of the three first electrodes 110;

step (S223), applying a green light organic electroluminescent film 1252 on a surface of a third template 154;

step (S224), contacting the second one of the three first electrodes 110 with the green light organic electroluminescent film 1252;

step (S225), separating the second one of the three first electrodes 110 from the third template 154 so that a green light organic light emitting layer 120 is formed on the second one of the three first electrodes 110; and step (S226), transfer printing a blue light organic light emitting layer 120 on the third one of the three first electrodes 110 by the process above.

In step (S221), the second one and third one of the three first electrodes 110 are not in contact with the red light organic electroluminescent film 1252. The step (S221) can be achieved by only applying the red light organic electroluminescent film 1252 on part of the second template 152 corresponding to the first one of the three first electrodes 110, covering the red light organic electroluminescent film 1252 corresponding to the second one and third one of the three first electrodes 110, or allowing red light organic electroluminescent film 1252 have different heights. In one embodiment, the second template 152 has a first surface 1522 and a second surface 1524. The first surface 1522 and the second surface 1524 have different heights so that the red light organic electroluminescent film 1252 on the second template 152 has different heights. Because the red light organic electroluminescent film 1252 has a uniform thickness, the red light organic electroluminescent film 1252 on the first surface 1522 is higher than the red light organic electroluminescent film 1252 on the second surface 1524. When the first one of the three first electrodes 110 touches the red light organic electroluminescent film 1252 on the first surface 1522, the second one and third one of the three first electrodes 110 are spaced from the red light organic electroluminescent film 1252 on the second surface 1524.

In step (S224), the red light organic light emitting layer 120 and the third one of the three first electrodes 110 are not in contact with the green light organic electroluminescent film 1252. In one embodiment, the third template 154 has a third surface 1542 and a fourth surface 1544. The third surface 1542 and the fourth surface 1544 have different heights so that the green light organic electroluminescent film 1252 on the third template 154 has different heights. Because the green light organic electroluminescent film 1252 has a uniform thickness, the green light organic electroluminescent film 1252 on the third surface 1542 is higher than the green light organic electroluminescent film 1252 on the fourth surface 1544. When the second one of the three first electrodes 110 touches the green light organic electroluminescent film 1252 on the third surface 1542, the red light organic light emitting layer 120 and the third one of the three first electrodes 110 are spaced from the green light organic electroluminescent film 1252 on the fourth surface 1544. The height difference between the third surface 1542 and the fourth surface 1544 is greater than the height difference between the first surface 1522 and the second surface 1524.

Figure 11:
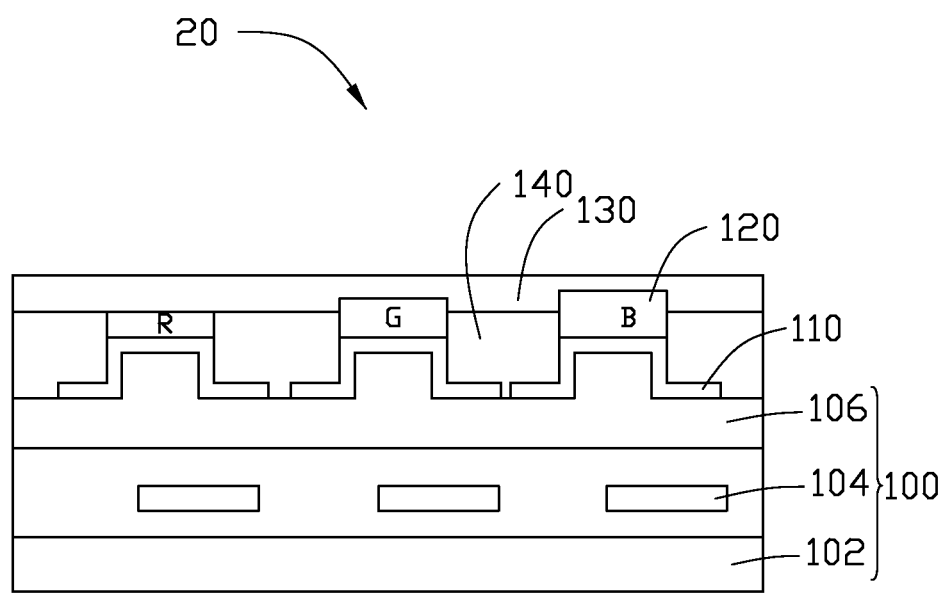
FIG. 11 is a schematic view of one embodiment of an organic light emitting diode array.

FIG. 11 illustrate an organic light emitting diode array 20 of one embodiment. The organic light emitting diode array 20 includes a base 100, a plurality of first electrodes 110, a plurality of organic light emitting layers 120, a patterned second insulative layer 140, and a second electrode 130. The organic light emitting diode array 20 is similar to the organic light emitting diode array 10 except that three organic light emitting layers 120 of the same pixel unit includes a red light organic light emitting layer 120, a green light organic light emitting layer 120, and a blue light organic light emitting layer 120. Thus, the organic light emitting diode array 20 can achieve full color display.

In one embodiment, the red light organic light emitting layer 120, the green light organic light emitting layer 120, and the blue light organic light emitting layer 120 of the same pixel unit can have different thickness. Because the protrudent surfaces of the three first electrodes 110 have the same height, the surfaces of the red light organic light emitting layer 120, the green light organic light emitting layer 120, and the blue light organic light emitting layer 120 that is opposite to the three first electrodes 110 have different heights. The surface of the patterned second insulative layer 140 that is opposite to the base 100 can be flushed with any one of the surfaces of the red light organic light emitting layer 120, the green light organic light emitting layer 120, and the blue light organic light emitting layer 120 that is opposite to the three first electrodes 110. In one embodiment, the surface of the patterned second insulative layer 140 that is opposite to the base 100 is flushed with the surface of the red light organic light emitting layer 120. The green light organic light emitting layer 120 and the blue light organic light emitting layer 120 extends out of the patterned second insulative layer 140 and are embedded in to the second electrode 130.

Figure 12:
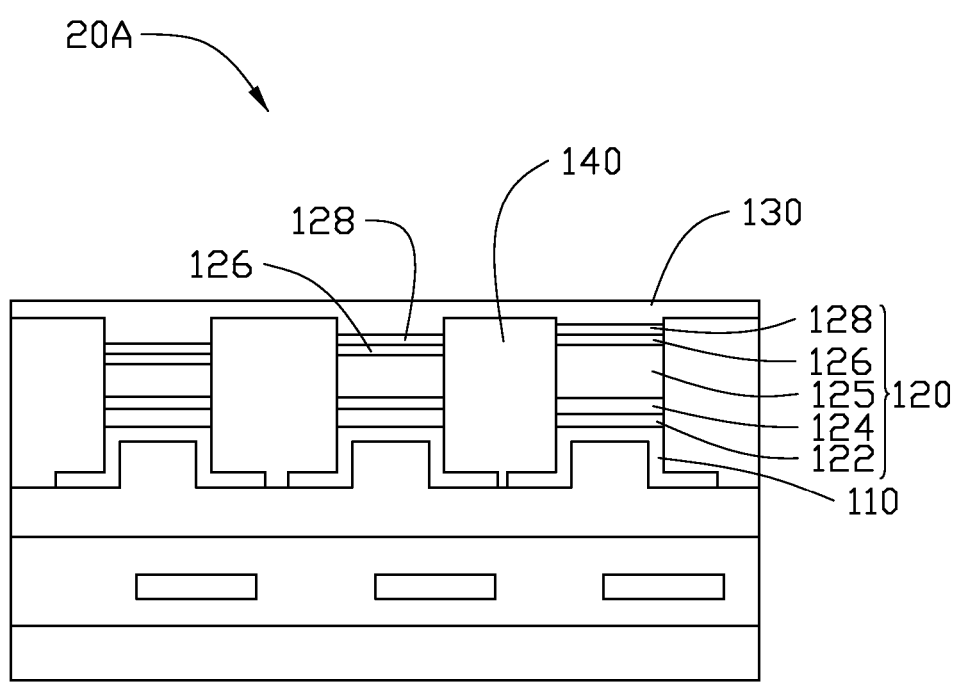
FIG. 12 is a schematic view of one embodiment of an organic light emitting diode array.

FIG. 12 illustrate an organic light emitting diode array 20A of another embodiment. In the organic light emitting diode array 20A, the organic light emitting layer 120 includes a hole injection layer 122, a hole transport layer 124, an electroluminescent layer 125, an electron transport layer 126, and an electron injection layer 128. The hole injection layer 122 and the hole transport layer 124 are located between the first electrode 110 and the electroluminescent layer 125. The hole injection layer 122 and the hole transport layer 124 have the same thickness and heights. The electroluminescent layers 125 have different thickness and heights. The electron transport layer 126 and the electron injection layer 128 are located between the electroluminescent layer 125 and the second electrode 130. The electron transport layer 126 and the electron injection layer 128 have the same thickness and different heights. The surface of the patterned second insulative layer 140 that is opposite to the base 100 is flushed with the highest surface of the electron injection layer 128. A part of the second electrode 130 is embedded in to the patterned second insulative layer 140 and in direct contact with the other two electron injection layers 128. The organic light emitting layer 120 of FIG. 12 can be made by making the hole injection layer 122 and the hole transport layer 124 on the first electrodes 110 via the method of FIG. 5 or vacuum evaporation; transfer printing the electroluminescent layers 125 by the method of FIGS. 9-10; and making the electron transport layer 126 and the electron injection layer 128 by or vacuum evaporation.

Figure 13:
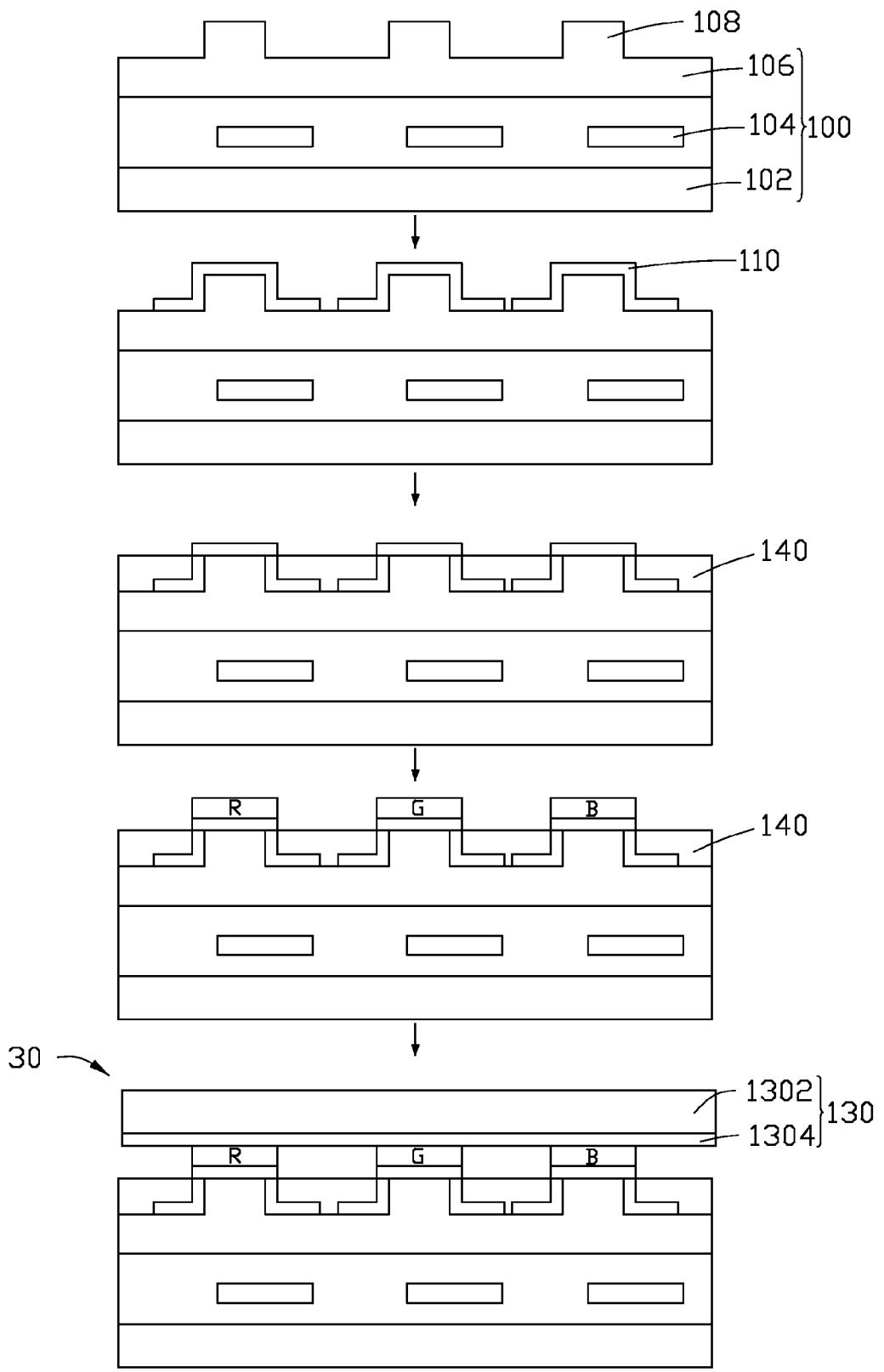
FIG. 13 is a flow chart of one embodiment of a method for making an organic light emitting diode array.

Referring to FIG. 13 illustrates a method of one embodiment for making an organic light emitting diode array 30. The method includes following steps:

step (S30), providing a base 100, wherein the base 100 includes a substrate 102, a plurality of thin-film transistors 104 located on a surface of the substrate 102 and arranged to form an array, and a first insulative layer 106 located on a surface of the plurality of thin-film transistors 104; the first insulative layer 106 defines a plurality of convexities 108 on a surface opposite to the plurality of thin-film transistors 104;

step (S31), forming a plurality of first electrodes 110 on the plurality of convexities 108, wherein each of the plurality of first electrodes 110 is located corresponding to and electrically connected to one of the plurality of thin-film transistors 104;

step (S32), making a patterned second insulative layer 140 to cover parts of the plurality of first electrodes 110 between the plurality of convexities 108 and expose protrudent surfaces of the plurality of first electrodes 110 on the smooth top surfaces 109 of the plurality of convexities 108;

step (S33), applying a plurality of organic light emitting layers 120 on the plurality of first electrodes 110, wherein adjacent three of the plurality of organic light emitting layers 120 have different organic electroluminescent materials; and step (S34), electrically connecting a second electrode 130 to the plurality of organic light emitting layers 120.

The method for making the organic light emitting diode array 30 is similar to the method for making the organic light emitting diode array 20 except that the patterned second insulative layer 140 is applied before the plurality of organic light emitting layers 120, and the three organic light emitting layers 120 of the same pixel unit have the same thickness.

In step (S32), because the patterned second insulative layer 140 is applied before the plurality of organic light emitting layers 120, it can prevent the plurality of organic light emitting layers 120 from being damaged and polluted when the patterned second insulative layer 140 is made by etching. The surface of the patterned second insulative layer 140 can be flushed with the smooth top surfaces 109 of the plurality of convexities 108.

In step (S33), because parts of the plurality of first electrodes 110 on the smooth top surfaces 109 of the plurality of convexities 108 are exposed and protruded out of the patterned second insulative layer 140, the plurality of organic light emitting layers 120 can be transfer printed on the plurality of first electrodes 110 easily. The plurality of organic light emitting layers 120 can be transfer printed by the method of FIGS. 9-10.

In step (S34), the second electrode 130 is formed by coating an electrically conductive film 1304 on a surface of a free standing support 1302, and then placing the electrically conductive film 1304 on the plurality of organic light emitting layers 120. The electrically conductive film 1304 is in direct contact with the plurality of organic light emitting layers 120. Because part side surfaces of the plurality of first electrodes 110 are exposed from both the patterned second insulative layer 140 and the plurality of organic light emitting layers 120, if the second electrode 130 is formed by directly depositing, it will cause the first electrodes 110 and the second electrode 130 being in contact with each other and short. Parts of the second electrode 130 are suspended between adjacent two of the plurality of organic light emitting layers 120. The support 1302 can be a glass plate or a polymer sheet.

Figure 14:
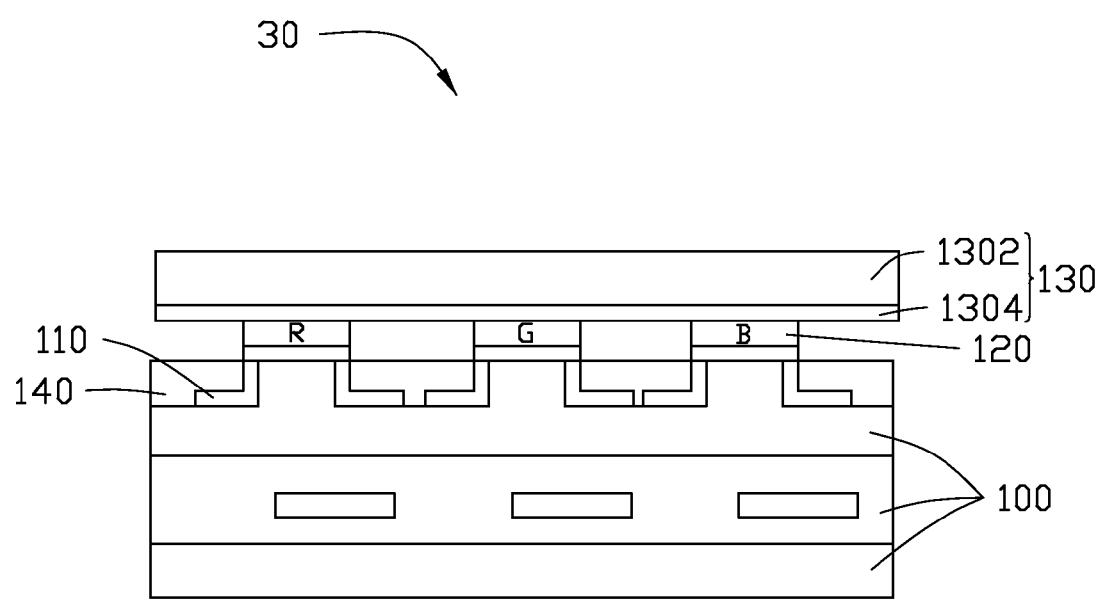
FIG. 14 is a schematic view of one embodiment of an organic light emitting diode array.

FIG. 14 illustrates an organic light emitting diode array 30 of one embodiment. The organic light emitting diode array 30 includes a base 100, a plurality of first electrodes 110, a plurality of organic light emitting layers 120, a patterned second insulative layer 140, and a second electrode 130. The organic light emitting diode array 30 is similar to the organic light emitting diode array 20 except that parts of the plurality of first electrodes 110 on the smooth top surfaces 109 of the plurality of convexities 108 are protruded out of the patterned second insulative layer 140, the second electrode 130 includes a free standing support 1302 and an electrically conductive film 1304. The support 1302 is a glass, and the electrically conductive film 1304 is a continuous indium tin oxide film.

Figure 15:
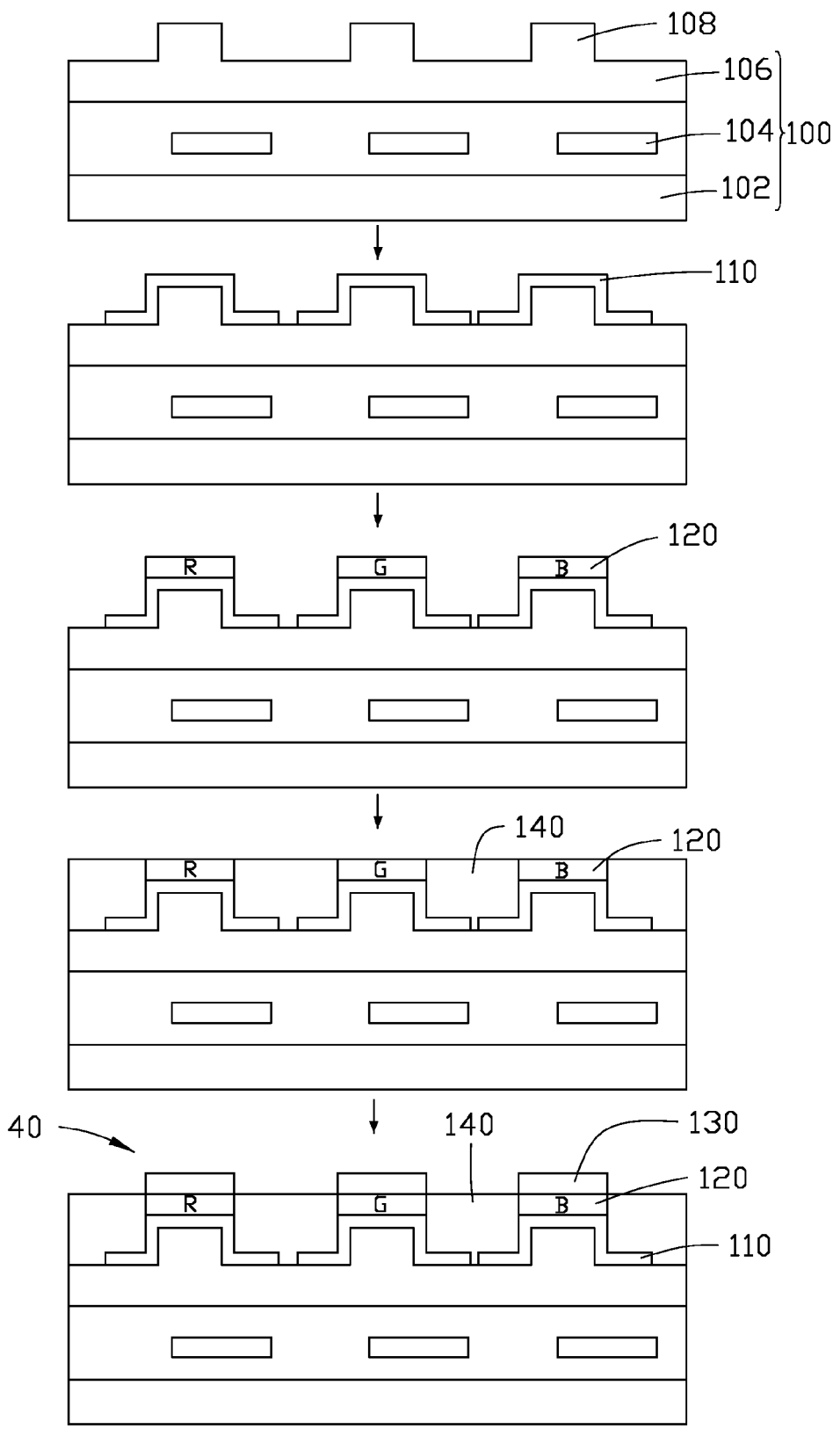
FIG. 15 is a flow chart of one embodiment of a method for making an organic light emitting diode array.
Figure 16:
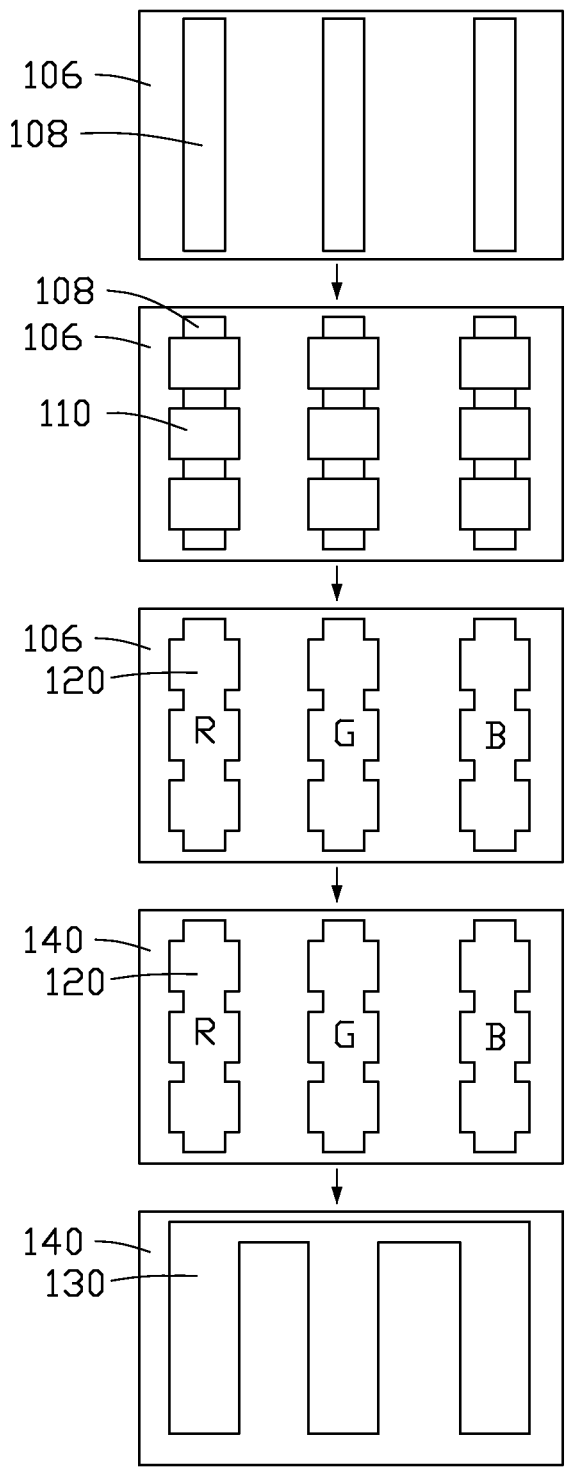
FIG. 16 is a top view of the flow chart of FIG. 15.

FIGS. 15-16 illustrates a method of one embodiment for making an organic light emitting diode array 40. The method includes following steps:

step (S40), providing a base 100, wherein the base 100 includes a substrate 102, a plurality of thin-film transistors 104 located on a surface of the substrate 102 and arranged to form an array, and a first insulative layer 106 located on a surface of the plurality of thin-film transistors 104; the first insulative layer 106 defines a plurality of convexities 108 on a surface opposite to the plurality of thin-film transistors 104;

step (S41), forming a plurality of first electrodes 110 on the plurality of convexities 108, wherein each of the plurality of first electrodes 110 is located corresponding to and electrically connected to one of the plurality of thin-film transistors 104;

step (S42), applying a plurality of organic light emitting layers 120 on the plurality of first electrodes 110, wherein adjacent three of the plurality of organic light emitting layers 120 have different organic electroluminescent materials;

step (S43), making a patterned second insulative layer 140 to cover the plurality of first electrodes 110 between the plurality of convexities 108 and expose each of the plurality of organic light emitting layers 120; and step (S44), electrically connecting a second electrode 130 to the plurality of organic light emitting layers 120.

The method for making the organic light emitting diode array 40 is similar to the method for making the organic light emitting diode array 20 except that the plurality of convexities 108 are strip-shaped and arranged in a one-dimensional array as shown in FIG. 3, each of the plurality of convexities 108 corresponds to a row of the plurality of thin-film transistors 104, and the second electrode 130 is comb-shaped.

In step (S41), a plurality of first electrodes 110 are located on a surface of each of the plurality of convexities 108 and spaced from each other. In step (S42), a strip-shaped organic light emitting layers 120 is transfer printed on entire surface of each of the strip-shaped convexity 108 to cover all of the corresponding strip-shaped convexity 108 and the plurality of first electrodes 110 on the corresponding strip-shaped convexity 108. The organic light emitting diodes corresponding to the same strip-shaped convexity 108 share the common strip-shaped organic light emitting layers 120 and luminesce light of the same color. In step (S44), the comb-shaped second electrode 130 includes a plurality of first strip-shaped conductors parallel with and spaced from each other, and a second strip-shaped conductors perpendicular with and connecting the plurality of first strip-shaped conductors. Each of the plurality of first strip-shaped conductors is located on the corresponding strip-shaped organic light emitting layers 120.

Figure 17:
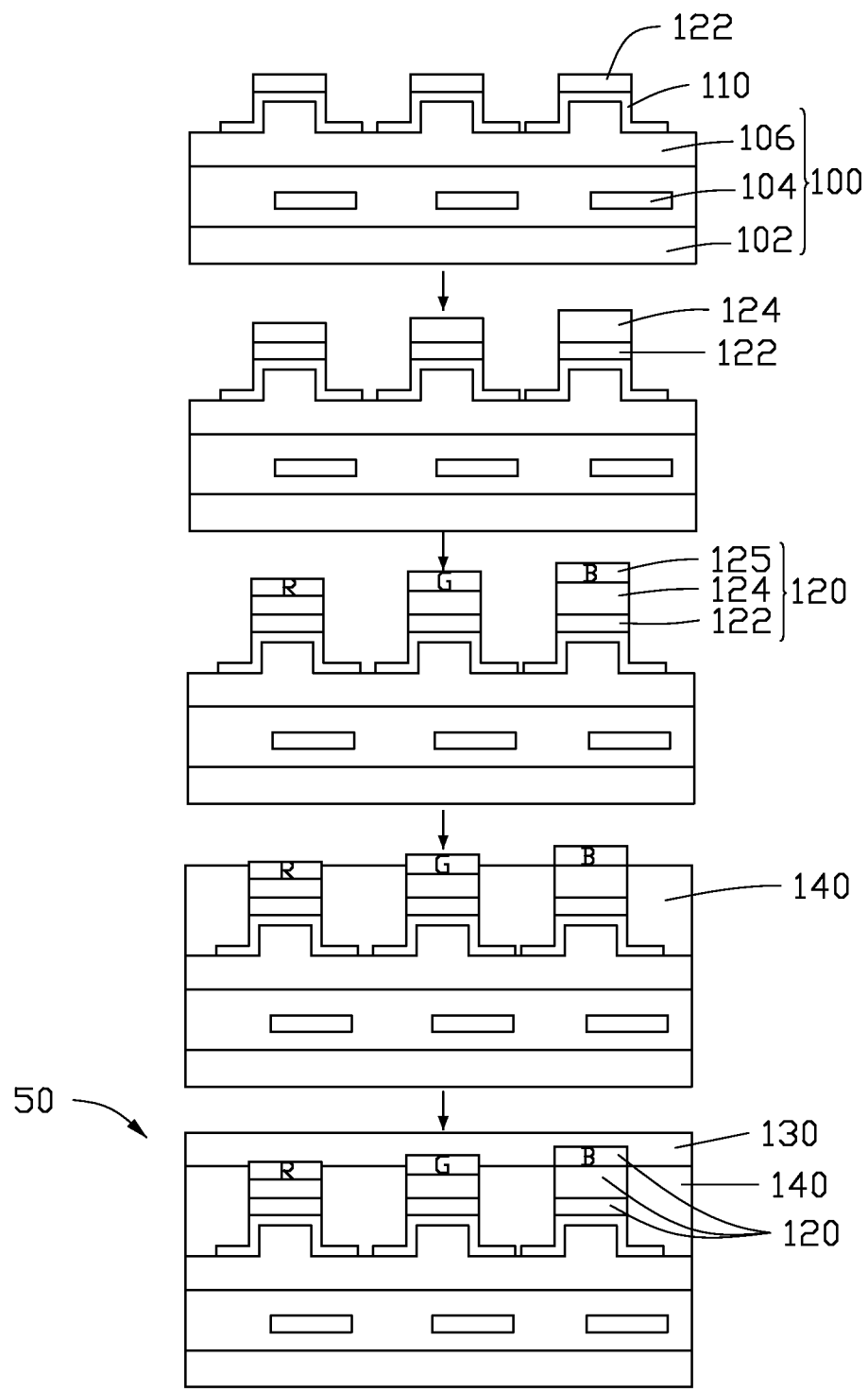
FIG. 17 is a flow chart of one embodiment of a method for making an organic light emitting diode array.

FIG. 17 illustrates a method of one embodiment for making an organic light emitting diode array 50. The method includes following steps:

step (S50), providing a base 100, wherein the base 100 includes a substrate 102, a plurality of thin-film transistors 104 located on a surface of the substrate 102 and arranged to form an array, and a first insulative layer 106 located on a surface of the plurality of thin-film transistors 104; the first insulative layer 106 defines a plurality of convexities 108 on a surface opposite to the plurality of thin-film transistors 104;

step (S51), forming a plurality of first electrodes 110 on the plurality of convexities 108, wherein each of the plurality of first electrodes 110 is located corresponding to and electrically connected to one of the plurality of thin-film transistors 104;

step (S52), applying a plurality of hole injection layers 122 on the plurality of first electrodes 110;

step (S53), transfer printing a plurality of hole transport layers 124 on the plurality of hole injection layers 122, wherein adjacent three of the plurality of hole transport layers 124 of the same pixel unit have different thickness;

step (S54), making a plurality of electroluminescent layers 125 on the plurality of hole transport layers 124, wherein adjacent three of the plurality of electroluminescent layers 125 of the same pixel unit have different organic electroluminescent materials;

step (S55), making a patterned second insulative layer 140 to cover the plurality of first electrodes 110 between the plurality of convexities 108 and expose each of the plurality of electroluminescent layers 125; and step (S56), electrically connecting a second electrode 130 to the plurality of electroluminescent layers 125.

The method for making the organic light emitting diode array 50 is similar to the method for making the organic light emitting diode array 20 except that the plurality of hole injection layers 122 and the plurality of hole transport layers 124 are applied on the plurality of first electrodes 110 before the plurality of electroluminescent layers 125. The plurality of hole injection layers 122 have the same thickness, and the plurality of hole transport layers 124 have different thickness. Each of the organic light emitting layers 120 includes the hole injection layer 122, the hole transport layer 124, and the electroluminescent layer 125. The plurality of hole injection layers 122 can be made by the method of FIG. 5 or vacuum evaporation, and the plurality of electroluminescent layers 125 can be made by the method of FIGS. 9-10 or vacuum evaporation.

Figure 18:
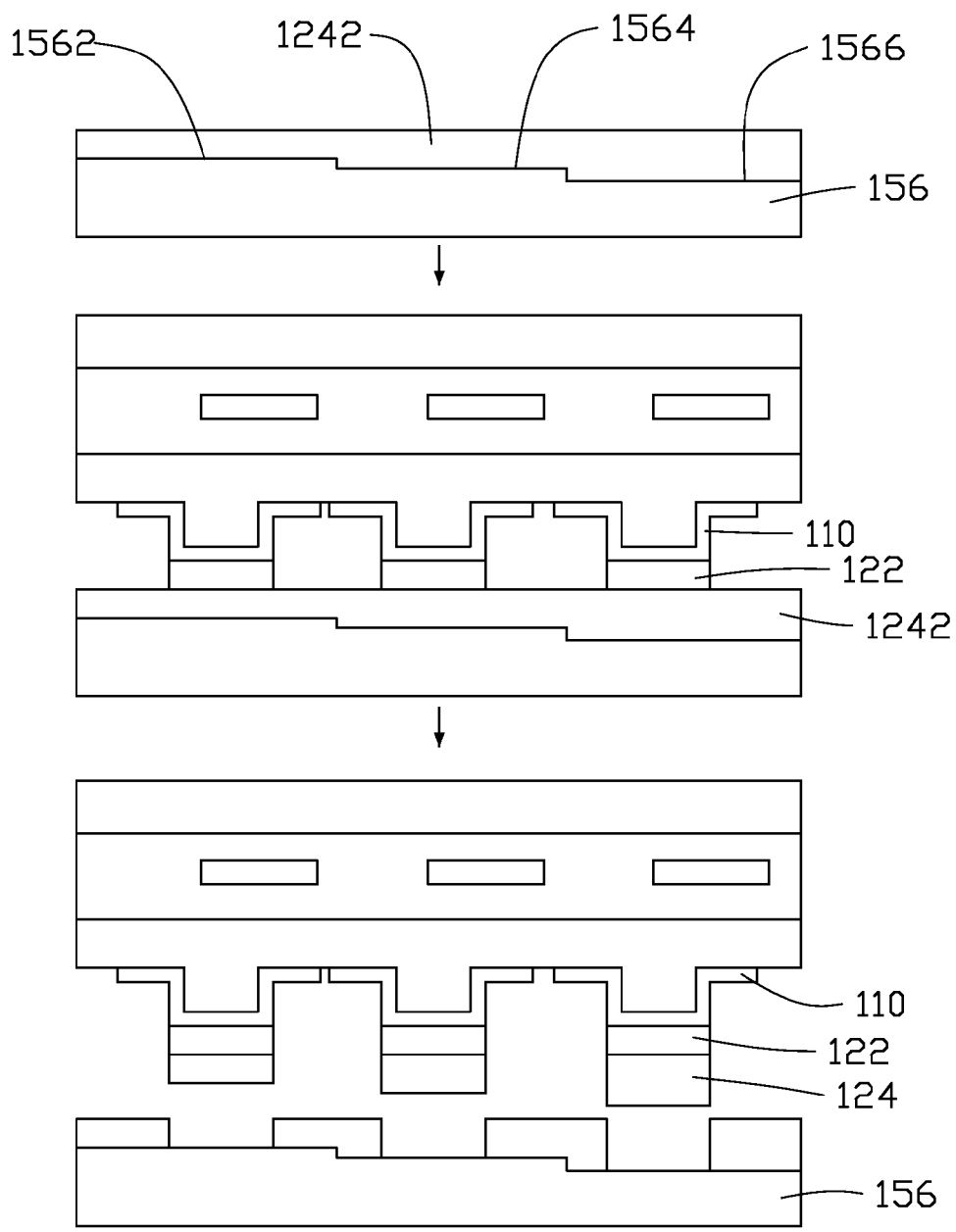
FIG. 18 is a flow chart of one embodiment of a method for making a hole transport layer with different thickness by transfer printing once time.

FIG. 18 illustrates a method for transfer printing the plurality of hole transport layers 124 with different thickness once time. The method includes following steps:

step (S530), forming a hole transport film 1242 on a surface of a fourth template 156, wherein the hole transport film 1242 has different thickness corresponding to the plurality of hole injection layers 122 of the same pixel unit;

step (S531), contacting the plurality of hole injection layers 122 with the hole transport film 1242; and step (S532), separating the plurality of hole injection layers 122 from the fourth template 156.

In step (S530), the hole transport film 1242 can be made by spin-coating, spray-coating, brush-coating, or immerse-coating. The fourth template 156 has a fifth surface 1562 and a sixth surface 1564, and a seventh surface 1566. The fifth surface 1562, the sixth surface 1564, and the seventh surface 1566 have different heights. In one embodiment, the fifth surface 1562 is higher than the sixth surface 1564, and the sixth surface 1564 is higher than the seventh surface 1566. When the hole transport film 1242 is applied on the fourth template 156, the surface of the hole transport film 1242 that is opposite to the fourth template 156 is a planar. Thus, the hole transport film 1242 on the fifth surface 1562, the hole transport film 1242 on the sixth surface 1564, and the hole transport film 1242 on the seventh surface 1566 have different thickness. The method of FIG. 18 can also be used to make the plurality of hole injection layers 122, the plurality of electroluminescent layers 125, the plurality of electron transport layers 126 and the plurality of electron injection layers 128.

Figure 19:
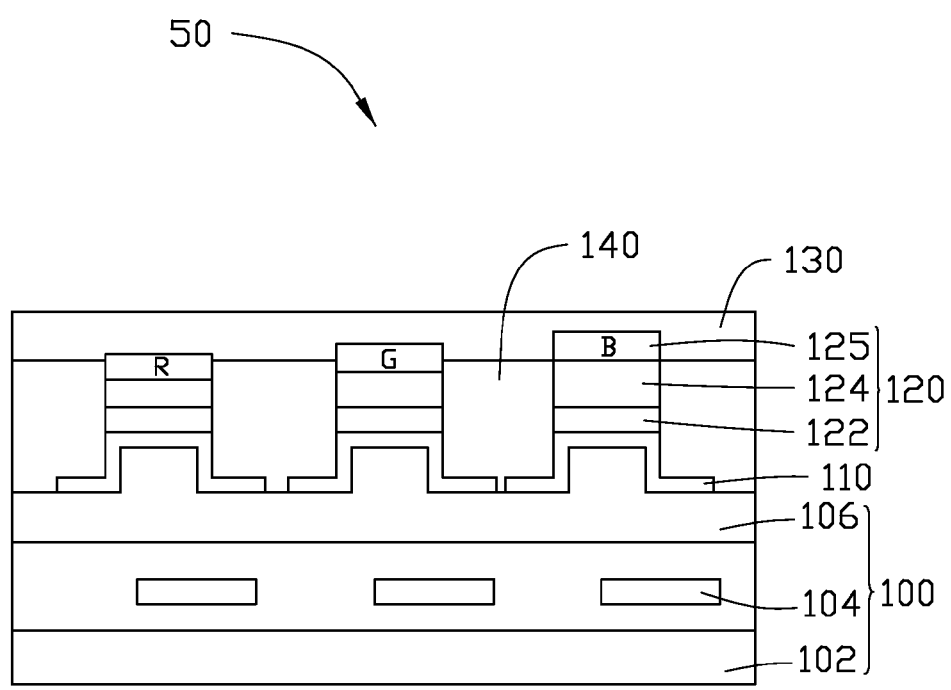
FIG. 19 is a schematic view of one embodiment of an organic light emitting diode array.

FIG. 19 illustrates an organic light emitting diode array 50 of one embodiment. The organic light emitting diode array 50 includes a base 100, a plurality of first electrodes 110, a plurality of organic light emitting layers 120, a patterned second insulative layer 140, and a second electrode 130. The organic light emitting diode array 50 is similar to the organic light emitting diode array 20 except that each of the organic light emitting layers 120 includes the hole injection layer 122, the hole transport layer 124, and the electroluminescent layer 125 stacked with each other. The plurality of hole injection layers 122 have the same thickness, the plurality of electroluminescent layers 125 have the same thickness, and the plurality of hole transport layers 124 have different thickness. Because the plurality of hole transport layers 124 have different thickness, the surfaces of the plurality of hole transport layers 124 that are opposite to the plurality of hole injection layers 122 have different heights. The surfaces of the plurality of electroluminescent layers 125 that are opposite to the plurality of hole injection layers 122 have different heights. Thus, the red light, the green light and the blue light can be mixed uniformly.

Figure 20:
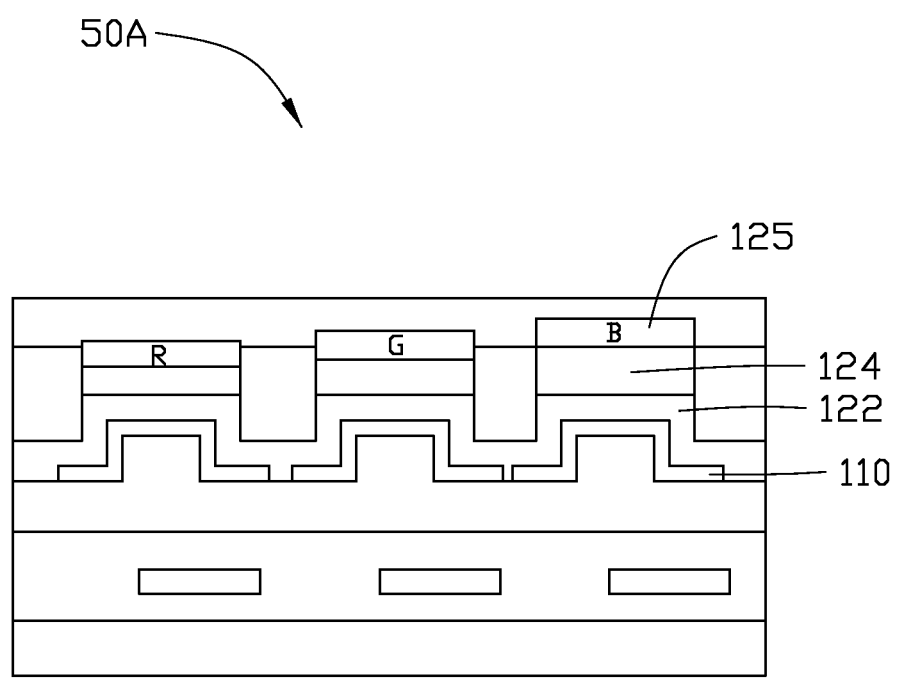
FIG. 20 is a schematic view of one embodiment of an organic light emitting diode array.

FIG. 20 illustrates an organic light emitting diode array 50A of another embodiment. In the organic light emitting diode array 50A, the hole injection layer 122 is a continuous layer and covers all of the plurality of first electrodes 110. The organic light emitting diode array 50A shares a common hole injection layer 122. The continuous hole injection layer 122 can be made by vacuum evaporation or immerse-coating.

Figure 21:
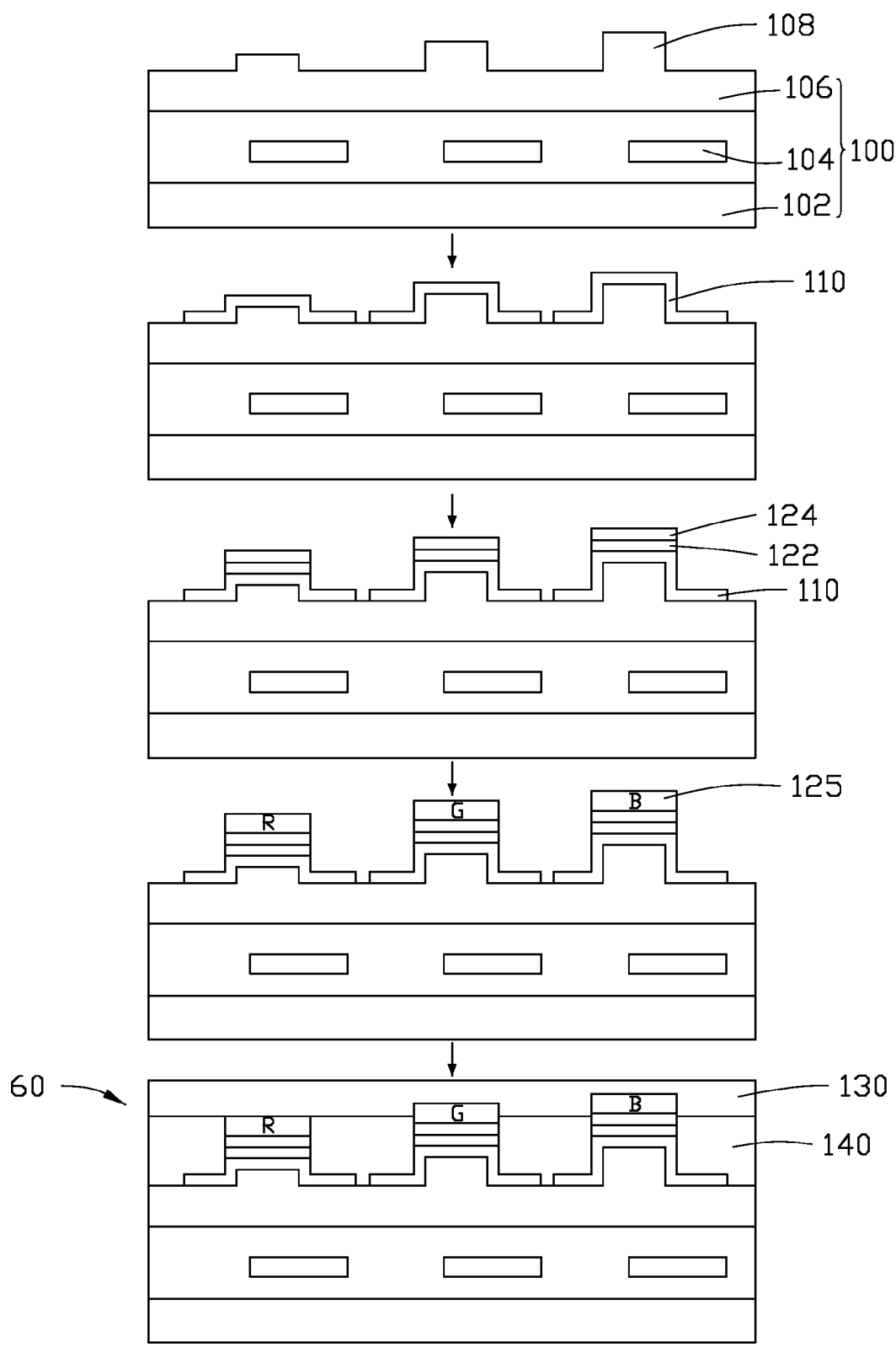
FIG. 21 is a flow chart of one embodiment of a method for making an organic light emitting diode array.

FIG. 21 illustrates a method of one embodiment for making an organic light emitting diode array 60. The method includes following steps:

step (S60), providing a base 100, wherein the base 100 includes a substrate 102, a plurality of thin-film transistors 104 located on a surface of the substrate 102 and arranged to form an array, and a first insulative layer 106 located on a surface of the plurality of thin-film transistors 104; the first insulative layer 106 defines a plurality of convexities 108 with different heights;

step (S61), forming a plurality of first electrodes 110 on the plurality of convexities 108, wherein each of the plurality of first electrodes 110 is located corresponding to and electrically connected to one of the plurality of thin-film transistors 104;

step (S62), applying a plurality of hole injection layers 122 and a plurality of hole transport layers 124 on the plurality of first electrodes 110;

step (S63), making a plurality of electroluminescent layers 125 on the plurality of hole transport layers 124, wherein adjacent three of the plurality of electroluminescent layers 125 of the same pixel unit have different organic electroluminescent materials;

step (S64), making a patterned second insulative layer 140 to cover the plurality of first electrodes 110 between the plurality of convexities 108 and expose each of the plurality of electroluminescent layers 125; and step (S65), electrically connecting a second electrode 130 to the plurality of electroluminescent layers 125.

The method for making the organic light emitting diode array 60 is similar to the method for making the organic light emitting diode array 50 except that the plurality of convexities 108 have different heights, the plurality of hole injection layers 122 have the same thickness, and the plurality of hole transport layers 124 have the same thickness. In step (S62), the plurality of hole injection layers 122 and the plurality of hole transport layers 124 can be made by vacuum evaporation or transfer printing.

Figure 22:
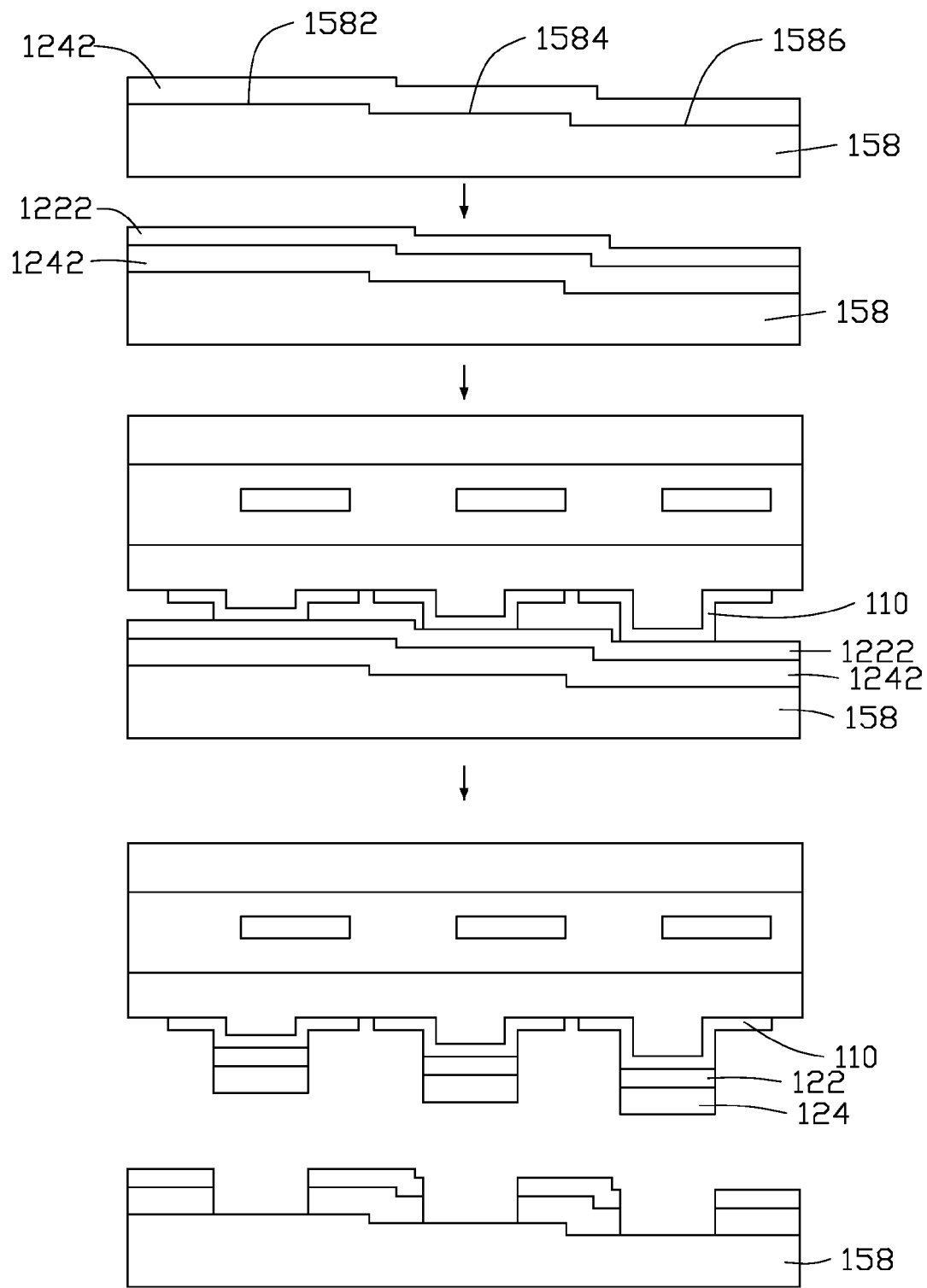
FIG. 22 is a flow chart of one embodiment of a method for making a hole injection layer and a hole transport layer with different thickness by transfer printing once time.

FIG. 22 illustrates a method for transfer printing the plurality of hole injection layers 122 and the plurality of hole transport layers 12 once time. The method includes following steps:

step (S620), forming a hole transport film 1242 on a surface of a fifth template 158, wherein the hole transport film 1242 has different heights corresponding to adjacent three of the plurality of first electrodes 110 of the same pixel unit;

step (S621), forming a hole injection film 1222 on a surface of the hole transport film 1242, wherein the hole injection film 1222 also has different heights corresponding to adjacent three of the plurality of first electrodes 110 of the same pixel unit;

step (S622), contacting the plurality of first electrodes 110 with the hole injection film 1222; and step (S623), separating the plurality of first electrodes 110 from the fifth template 158.

In step (S620), the fifth template 158 has an eighth surface 1582, a ninth surface 1584, and a tenth surface 1586. The eighth surface 1582, the ninth surface 1584, and the tenth surface 1586 have different heights. The height differences of the eighth surface 1582, the ninth surface 1584, and the tenth surface 1586 are designed according to the height differences of the plurality of convexities 108. The highest convexity 108 corresponds to the lowest one of the eighth surface 1582, the ninth surface 1584, and the tenth surface 1586. When the plurality of first electrodes 110 closes to the hole injection film 1222 on the fifth template 158, each of the plurality of first electrodes 110 can be in direct contact with the hole injection film 1222.

Both the hole injection film 1222 and the hole transport film 1242 has uniform thickness, so that the hole injection film 1222 and the hole transport film 1242 on the eighth surface 1582, the ninth surface 1584, and the tenth surface 1586 have different heights. The adhesion strength between the hole injection film 1222 and the hole transport film 1242 is greater than the adhesion strength between the hole transport film 1242 and the fifth template 158. Thus, the hole injection film 1222 and the hole transport film 1242 can be transferred from the fifth template 158 to the first electrodes 110 together. A wetting layer can be applied between the hole transport film 1242 and the fifth template 158. In one embodiment, the hole transport film 1242 is baked before applying the hole injection film 1222 so that the hole transport film 1242 would not be damaged in the wet membrane process of making the hole injection film 1222. The baked hole transport film 1242 can also be further wetted in the wet membrane process of making the hole injection film 1222. Furthermore, the hole injection film 1222 and the hole transport film 1242 can be made by transfer printing twice via the method of FIG. 22. The method of FIG. 22 can also be used to made the plurality of electroluminescent layers 125, the plurality of electron transport layers 126 and the plurality of electron injection layers 128.

Figure 23:
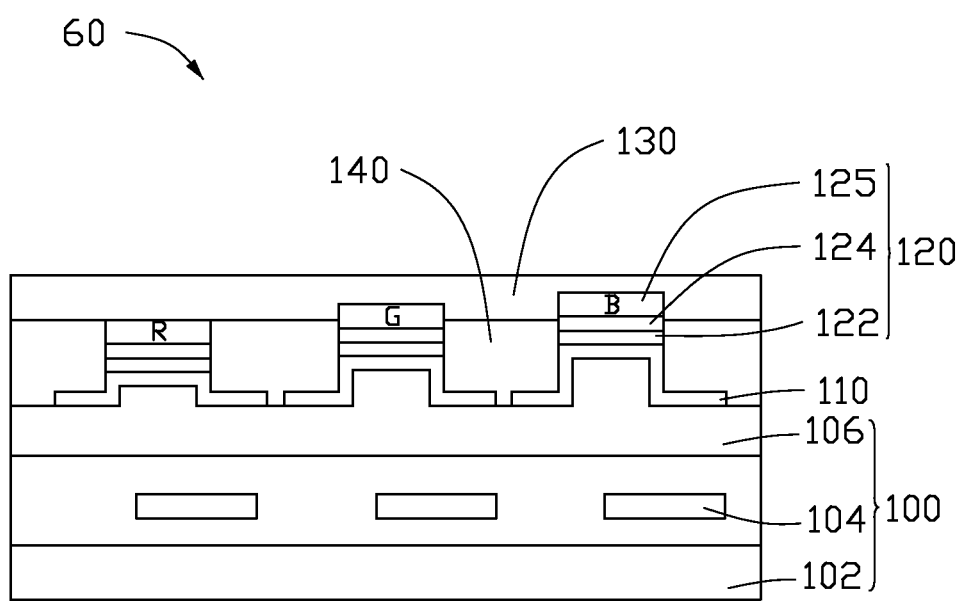
FIG. 23 is a schematic view of one embodiment of an organic light emitting diode array.

FIG. 23 illustrates an organic light emitting diode array 60 of one embodiment. The organic light emitting diode array 60 includes a base 100, a plurality of first electrodes 110, a plurality of organic light emitting layers 120, a patterned second insulative layer 140, and a second electrode 130. The organic light emitting diode array 60 is similar to the organic light emitting diode array 50 except that the plurality of convexities 108 have different heights, the plurality of hole injection layers 122 have the same thickness, the plurality of hole transport layers 124 have the same thickness, and the plurality of electroluminescent layers 125 have the same thickness.

Figure 24:
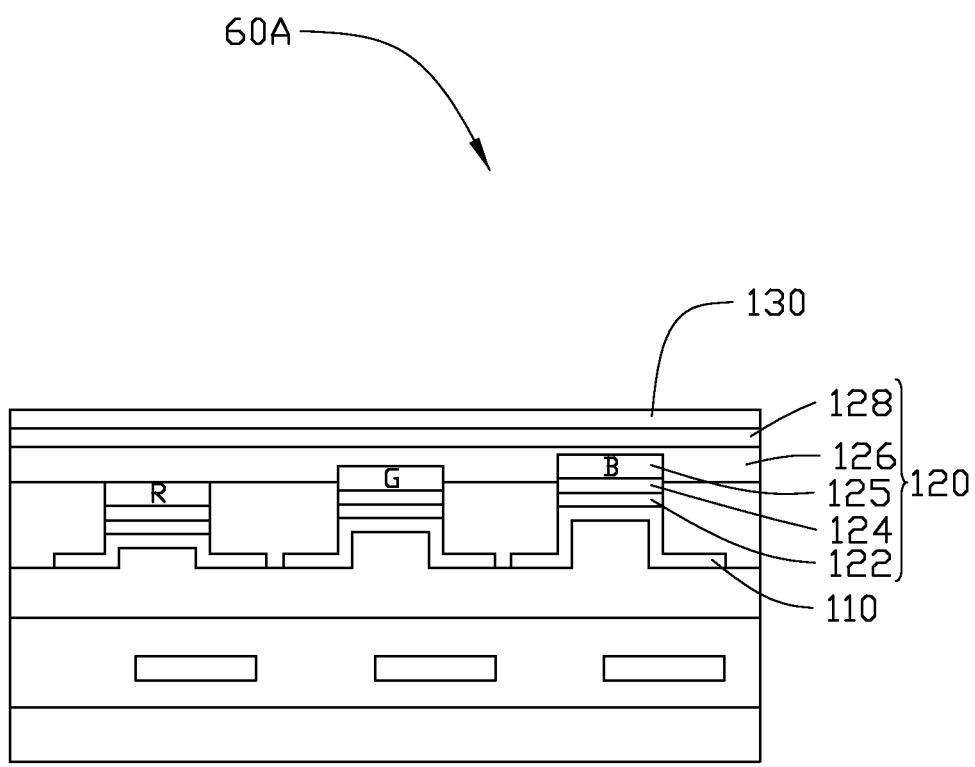
FIG. 24 is a schematic view of one embodiment of an organic light emitting diode array.

FIG. 24 illustrates an organic light emitting diode array 60A of another embodiment. In the organic light emitting diode array 60A, a continuous electron transport layer 126 and a continuous electron injection layer 128 are located between the plurality of electroluminescent layers 125 and the second electrode 130. The organic light emitting diode array 60A share a common electron transport layer 126 and a common electron injection layer 128. The electron transport layer 126 and the electron injection layer 128 can be made by vacuum evaporation or coating.

Figure 25:
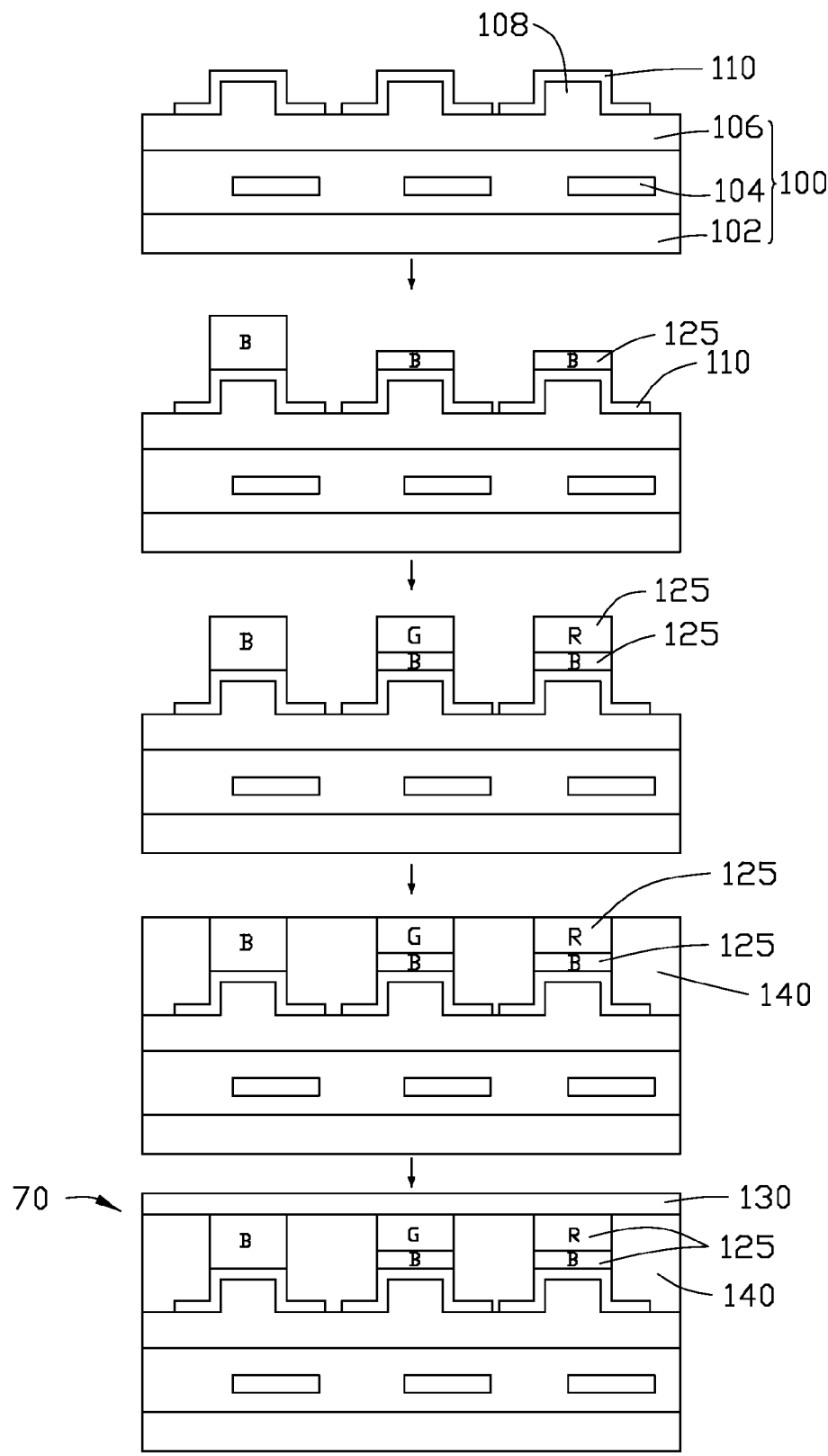
FIG. 25 is a flow chart of one embodiment of a method for making an organic light emitting diode array.

FIG. 25 illustrates a method of one embodiment for making an organic light emitting diode array 70. The method includes following steps:

step (S70), providing a base 100, wherein the base 100 includes a substrate 102, a plurality of thin-film transistors 104 located on a surface of the substrate 102 and arranged to form an array, and a first insulative layer 106 located on a surface of the plurality of thin-film transistors 104; the first insulative layer 106 defines a plurality of convexities 108;

step (S71), forming a plurality of first electrodes 110 on the plurality of convexities 108, wherein the plurality of first electrodes 110 are located corresponding to and electrically connected to the plurality of thin-film transistors 104 in a one-to-one manner;

step (S72), transfer printing a plurality of blue light electroluminescent layers 125 on the plurality of first electrodes 110, wherein one of the plurality of blue light electroluminescent layers 125 are higher than the other two of the plurality of blue light electroluminescent layers 125 in each pixel unit;

step (S73), making a red light electroluminescent layers 125 and a green light electroluminescent layers 125 on the lower two of the plurality of blue light electroluminescent layers 125;

step (S74), making a patterned second insulative layer 140 to cover the plurality of first electrodes 110 between the plurality of convexities 108 and expose the blue light electroluminescent layer 125, the red light electroluminescent layer 125, and the green light electroluminescent layer 125 of each pixel unit; and step (S75), electrically connecting a second electrode 130 to the blue light electroluminescent layer 125, the red light electroluminescent layer 125, and the green light electroluminescent layer 125 of each pixel unit.

The method for making the organic light emitting diode array 70 is similar to the method for making the organic light emitting diode array 20 except that the plurality of blue light electroluminescent layers 125 with different thickness are transfer printed on the plurality of first electrodes 110 directly by the method of FIG. 18, and then the red light electroluminescent layer 125 and the green light electroluminescent layer 125 are applied on the lower two of the plurality of blue light electroluminescent layers 125 respectively. The red light electroluminescent layer 125 and the green light electroluminescent layer 125 can be made by vacuum evaporation, or transfer printing method of FIGS. 9-10. The red light electroluminescent layer 125, the green light electroluminescent layer 125 and the highest blue light electroluminescent layer 125 have the same height. The blue light electroluminescent layers 125 of the organic light emitting diode array 70 can play the function of hole injection and hole transport. Furthermore, in step (S72), a plurality of red light or green light electroluminescent layers 125 with different heights can be applied first, and then, in step (S73), the other two kinds of different color electroluminescent layers 125 are formed on the lower two of the plurality of electroluminescent layers 125.

The organic light emitting diode arrays 10, 20, 20A, 30, 40, 50, 50A, 60, 60A, 70 are active matrix type organic light emitting diode arrays. The methods of FIG. 1, FIG. 8, FIG. 13, FIG. 15, FIG. 17, FIG. 21 and FIG. 25 can also be used to make the passive matrix type organic light emitting diode array.

Figure 26:
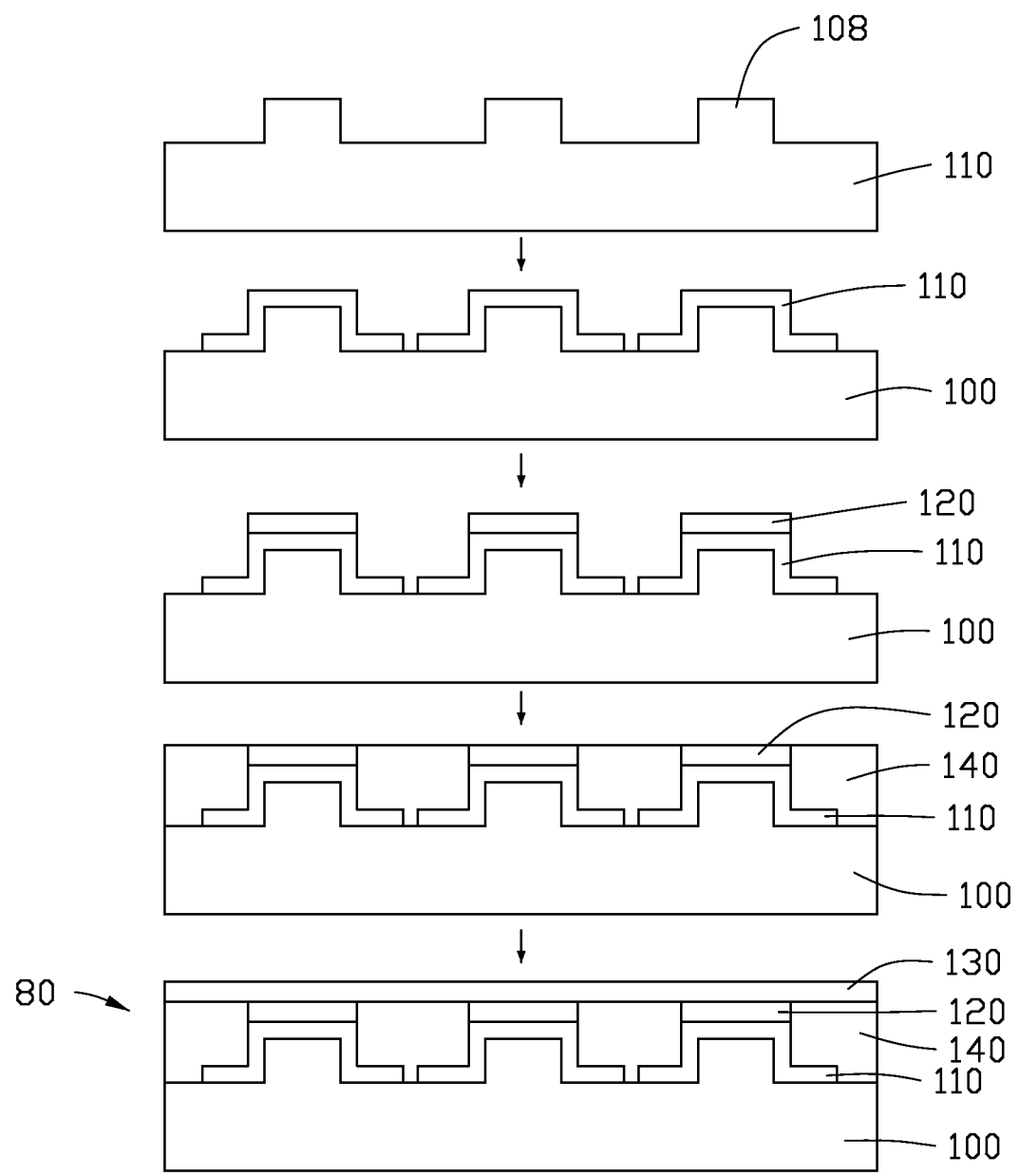
FIG. 26 is a flow chart of one embodiment of a method for making an organic light emitting diode array.

FIG. 26 illustrates a method of one embodiment for making a passive matrix type organic light emitting diode array 80. The method includes following steps:

step (S80), providing a base 100, wherein the base 100 defines a plurality of convexities 108 parallel with and spaced from each other;

step (S81), forming a plurality of first electrodes 110 on the plurality of convexities 108, wherein the plurality of first electrodes 110 are parallel with and spaced from each other, and each of the plurality of first electrodes 110 is located on a top surface of one of the plurality of convexities 108;

step (S82), applying a plurality of organic light emitting layers 120 on the plurality of first electrodes 110, wherein the plurality of organic light emitting layers 120 are located on a top surface of one of the plurality of first electrodes 110 in a one-to-one manner;

step (S83), making a patterned second insulative layer 140 to cover the plurality of first electrodes 110 and expose part of each of the plurality of organic light emitting layers 120; and step (S84), electrically connecting a plurality of second electrodes 130 to the plurality of organic light emitting layers 120, wherein the plurality of second electrodes 130 are parallel with, spaced from each other, and extend along a direction different from the extending direction of the plurality of first electrodes 110.

The method for making the organic light emitting diode array 80 is similar to the method for making the organic light emitting diode array 10 except that the plurality of first electrodes 110 and the plurality of second electrodes 130 have different structures, so that the organic light emitting diode array 80 is passive matrix type. Furthermore, in step (S80), the base 100 can be a glass substrate, a ceramic substrate, a silicon dioxide substrate, a silicon nitride substrate or a polymer substrate. The plurality of convexities 108 are strip-shaped and defined by the base 100.

Figure 27:
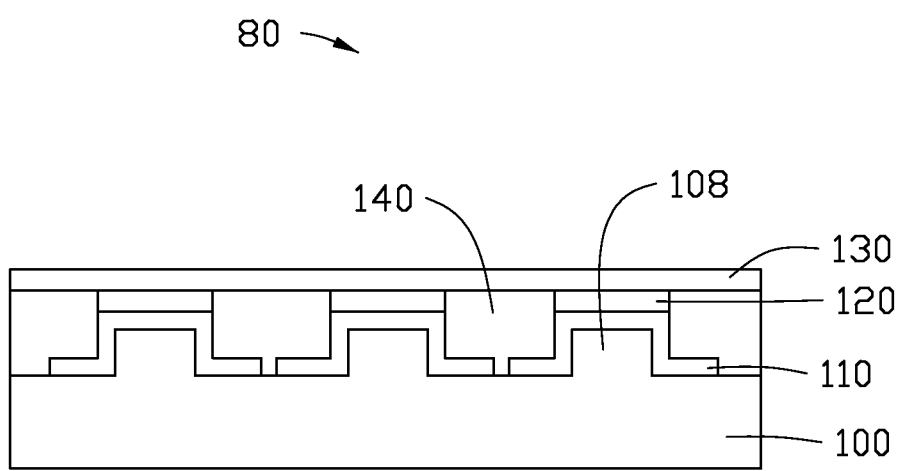
FIG. 27 is a schematic view of one embodiment of an organic light emitting diode array.
Figure 28:
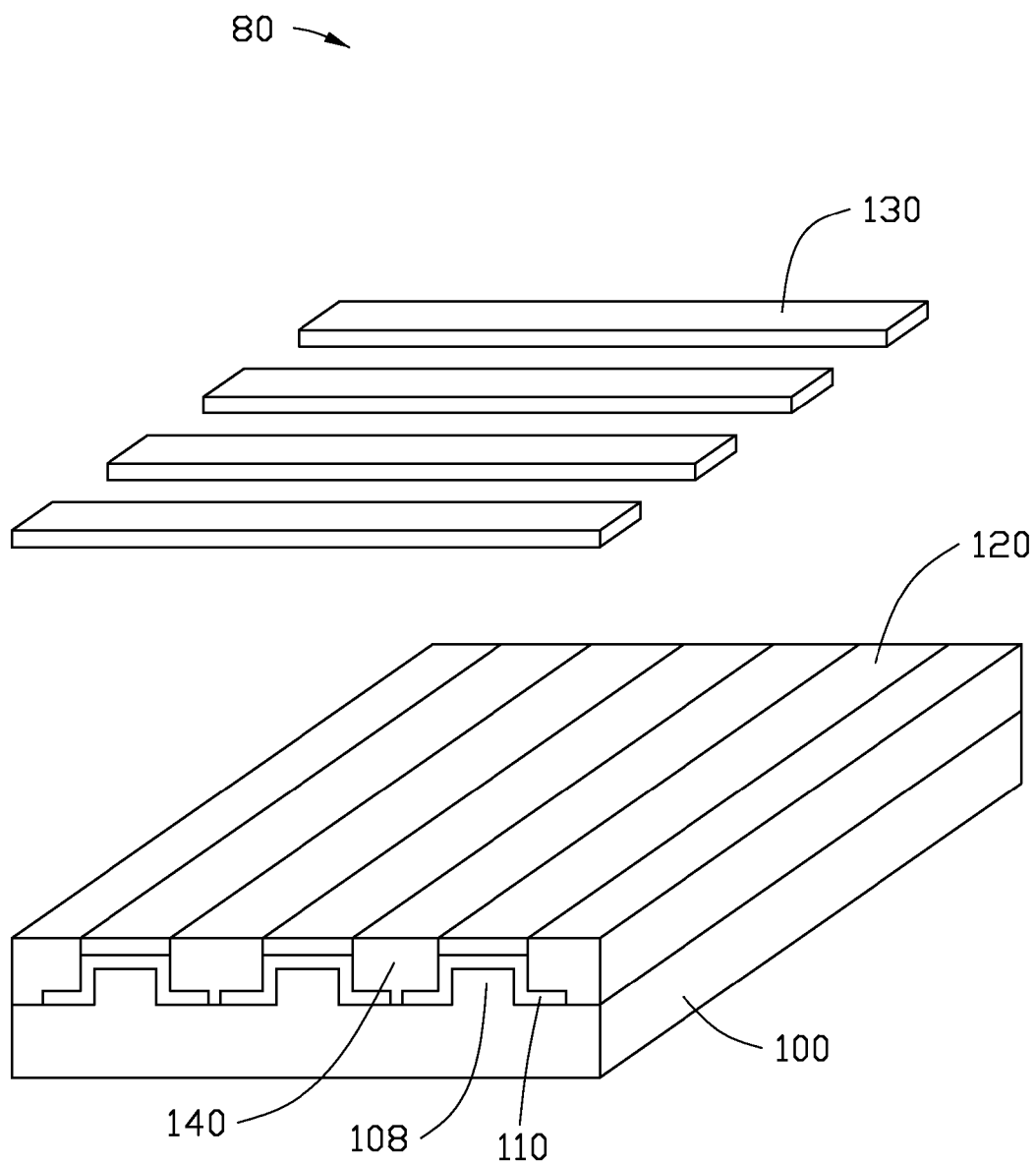
FIG. 28 is an exploded view of one embodiment of the organic light emitting diode array of FIG. 27.

FIGS. 27-28 illustrate a passive matrix type organic light emitting diode array 80 of one embodiment. The organic light emitting diode array 80 includes a base 100, a plurality of first electrodes 110, a plurality of organic light emitting layers 120, a patterned second insulative layer 140, and a plurality of second electrodes 130. The plurality of convexities 108 are strip-shaped, parallel with and spaced from each other, and formed on a surface of the base 100. The plurality of first electrodes 110 are parallel with and spaced from each other, and corresponds to the plurality of convexities 108 in a one-to-one manner. Each of the plurality of first electrodes 110 is located on both the top surface and side surface of the corresponding one of the plurality of convexities 108, and extends to the surface of the base 100 between adjacent two of the plurality of convexities 108. The plurality of organic light emitting layers 120 are strip-shaped, parallel with and spaced from each other, and located on the plurality of convexities 108 in a one-to-one manner. The plurality of organic light emitting layers 120 can be the same color organic light emitting layers, or different color organic light emitting layers such as a blue light, a red light, and a green light. The patterned second insulative layer 140 is located between adjacent two of the plurality of convexities 108. The plurality of second electrodes 130 extend along a direction perpendicular with the extending direction of the plurality of first electrodes 110. A plurality of sub-pixels are defined at the places where the plurality of second electrodes 130 across the plurality of first electrodes 110. In work, the plurality of second electrodes 130 and the plurality of first electrodes 110 are used as an address circuit to control the plurality of sub-pixels.

Figure 29:
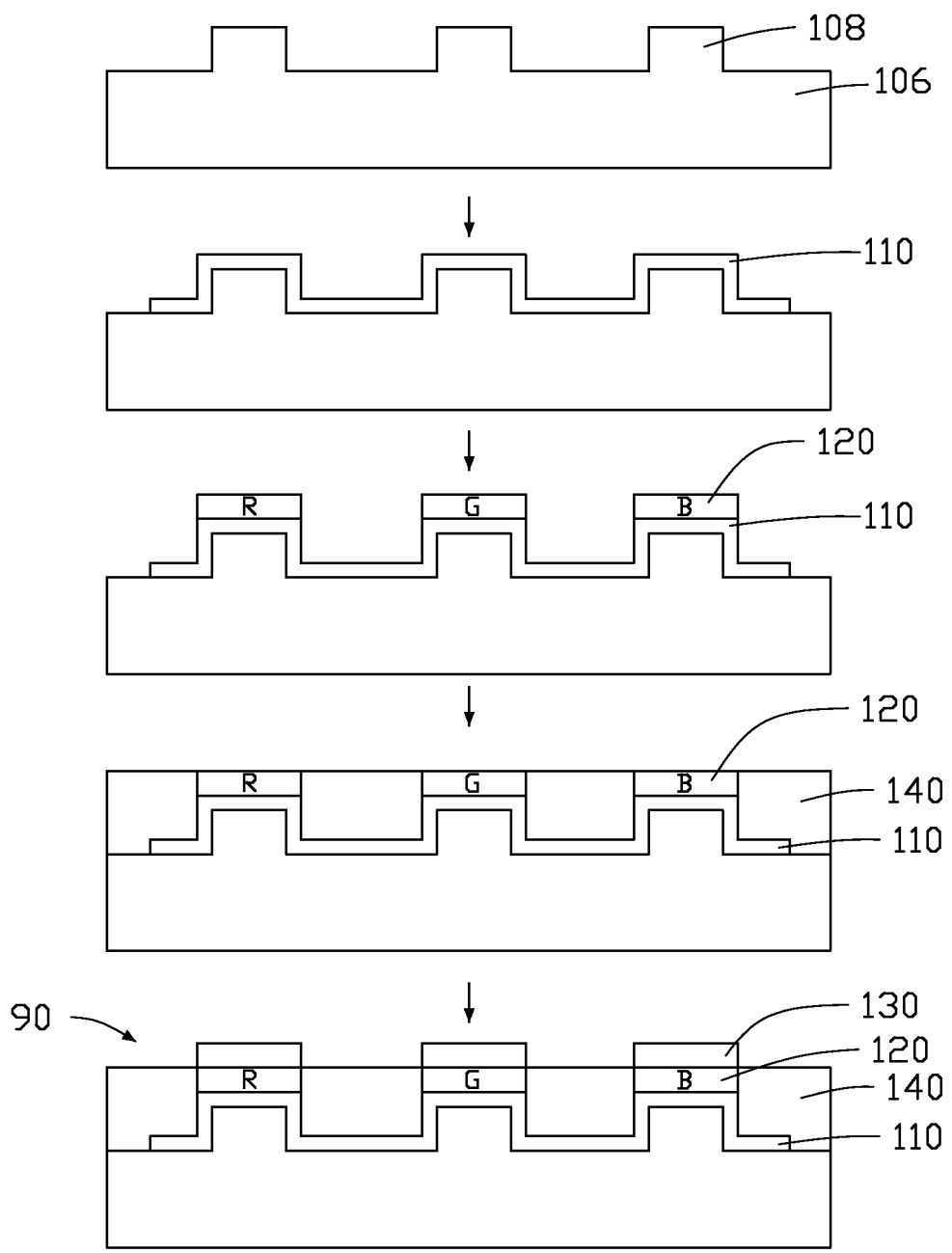
FIG. 29 is a flow chart of one embodiment of a method for making an organic light emitting diode array.

FIG. 29 illustrates a method of one embodiment for making a passive matrix type organic light emitting diode array 90. The method includes following steps:

step (S90), providing a base 100, wherein the base 100 defines a plurality of convexities 108 arranged in a two-dimensional array and spaced from each other;

step (S91), forming a plurality of first electrodes 110 on the plurality of convexities 108, wherein the plurality of first electrodes 110 are parallel with and spaced from each other, and each of the plurality of first electrodes 110 is located corresponding to the same row of the plurality of convexities 108;

step (S92), applying a plurality of organic light emitting layers 120 on the plurality of first electrodes 110, wherein the plurality of organic light emitting layers 120 are located corresponding to the plurality of convexities 108 in a one-to-one manner;

step (S93), making a patterned second insulative layer 140 to cover the plurality of first electrodes 110 and expose part of each of the plurality of organic light emitting layers 120; and step (S94), electrically connecting a plurality of second electrodes 130 to the plurality of organic light emitting layers 120, wherein the plurality of second electrodes 130 are parallel with, spaced from each other, and extend along a direction different from the extending direction of the plurality of first electrodes 110.

The method for making the organic light emitting diode array 90 is similar to the method for making the organic light emitting diode array 80 except that the plurality of convexities 108 are arranged to form a two-dimensional array, each of the plurality of first electrodes 110 is located corresponding to one row of the plurality of convexities 108, and each of the plurality of organic light emitting layers 120 is located corresponding to one of the plurality of convexities 108. In step (S91), each of the plurality of first electrodes 110 is continuous, located on both top surface and side surface of the corresponding row of the plurality of convexities 108, and extends to the surface of the extends to the surface of the base 100 between adjacent two of the plurality of convexities 108.

Figure 30:
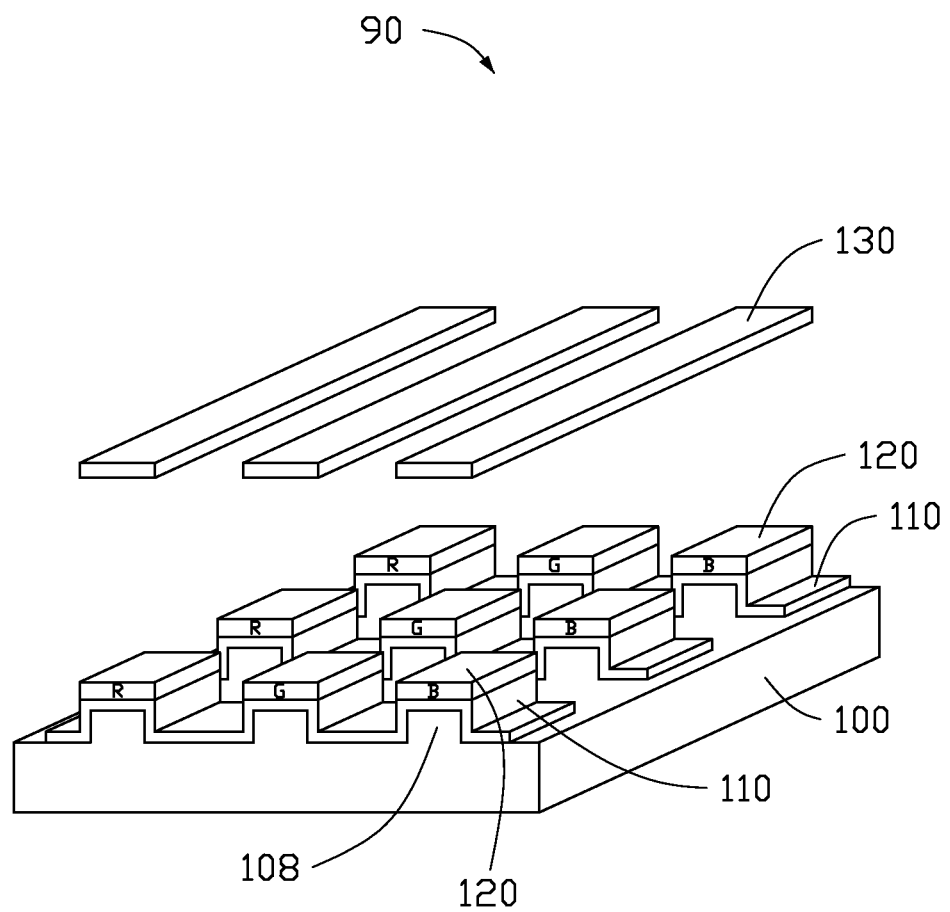
FIG. 30 is an exploded view of one embodiment of an organic light emitting diode array.

FIG. 30 illustrates a passive matrix type organic light emitting diode array 90 of one embodiment. The organic light emitting diode array 90 includes a base 100, a plurality of first electrodes 110, a plurality of organic light emitting layers 120, a patterned second insulative layer 140 (not shown in FIG. 30), and a plurality of second electrodes 130. The plurality of convexities 108 are arranged to form a two-dimensional array. The plurality of first electrodes 110 are parallel with and spaced from each other, and each of the plurality of first electrodes 110 is located corresponding to one row of the plurality of convexities 108. The plurality of organic light emitting layers 120 are located corresponding to the plurality of convexities 108 in a one-to-one manner and located on the protrudent surfaces of the first electrode 110 on the corresponding one of the plurality of convexities 108. The patterned second insulative layer 140 is located between adjacent two of the plurality of convexities 108. The plurality of second electrodes 130 extend along a direction perpendicular with the extending direction of the plurality of first electrodes 110. A plurality of sub-pixels are defined at the places where the plurality of second electrodes 130 across the plurality of first electrodes 110. Each of the organic light emitting layers 120 corresponds to one of the plurality of sub-pixels. The same column of organic light emitting layers 120 are the same color. In work, the plurality of second electrodes 130 and the plurality of first electrodes 110 are used as an address circuit to control the plurality of sub-pixels.

The embodiments shown and described above are only examples. Even though numerous characteristics and advantages of the present technology have been set forth in the foregoing description, together with details of the structure and function of the present disclosure, the disclosure is illustrative only, and changes may be made in the detail, including in matters of shape, size and arrangement of the parts within the principles of the present disclosure up to, and including, the full extent established by the broad general meaning of the terms used in the claims.

What is claimed is:

1. A method of making organic light emitting diode array, the method comprising:
   providing a base defining a plurality of convexities spaced from each other;
   forming a plurality of first electrodes on the plurality of convexities;
   making a patterned second insulative layer among the plurality of convexities to cover first parts of the plurality of first electrodes between the plurality of convexities and expose second parts of the plurality of first electrodes on top surfaces of the plurality of convexities to form a plurality of protrudent portions, wherein the plurality of protrudent portions extend out of the patterned second insulative layer by extending through a plurality of openings of the patterned second insulative layer;
   applying a plurality of organic light emitting layers on the plurality of protrudent portions comprising transfer printing at least a plurality of electroluminescent layers on the plurality of protrudent portions; and
   electrically connecting at least one second electrode to the plurality of organic light emitting layers.

2. The method of claim 1, wherein the base comprises a substrate; a plurality of thin-film transistors, located on a surface of the substrate and arranged to form an array; and a first insulative layer, located on a surface of the plurality of thin-film transistors and defining the plurality of convexities.

3. The method of claim 2, wherein the plurality of convexities are arranged in an array and corresponds to the plurality of thin-film transistors in a one-to-one manner; and the plurality of first electrodes are formed on the plurality of convexities in a one-to-one manner.

4. The method of claim 2, wherein the plurality of convexities are strip-shaped and in parallel with each other; each of the plurality of convexities is located corresponding to one row of the plurality of thin-film transistors; and more than two of the plurality of first electrodes are formed on each of the plurality of convexities.

5. The method of claim 2, wherein the forming the plurality of first electrodes on the plurality of convexities comprises:
   exposing part of each of the plurality of thin-film transistors by etching the base from the first insulative layer;

depositing a continuous conductive layer to cover the plurality of convexities and electrically connect to the plurality of thin-film transistors;

patterning the continuous conductive layer to obtain the plurality of first electrodes spaced from each other; and the plurality of first electrodes corresponds to and electrically connected to the plurality of thin-film transistors in a one-to-one manner.

6. The method of claim 5, wherein each of the plurality of first electrodes is located at least on a top surface and a side surface of one of the plurality of convexities, and extends to surfaces of the base between the plurality of convexities.

7. The method of claim 1, wherein the transfer printing at least the plurality of electroluminescent layers on the plurality of protrudent portions comprises:

applying an organic electroluminescent film on a surface of a template;

contacting the plurality of protrudent portions with the organic electroluminescent film; and separating the plurality of protrudent portions from the template.

8. The method of claim 7, wherein the applying the plurality of organic light emitting layers on the plurality of first electrodes by transfer printing further comprises heating the template so that a first adhesion strength between the organic electroluminescent film and the plurality of protrudent portions is stronger than a second adhesion strength between the organic electroluminescent film and the template.

9. The method of claim 1, wherein the transfer printing at least the plurality of electroluminescent layers on the plurality of protrudent portions comprises:

transfer printing a plurality of hole injection layers on the plurality of protrudent portions in a one-to-one manner;

transfer printing a plurality of hole transport layers on the plurality of hole injection layers in a one-to-one manner;

transfer printing the plurality of electroluminescent layers on the plurality of hole transport layers in a one-to-one manner; and making an electron transport layer and an electron injection layer on the plurality of electroluminescent layers.

10. The method of claim 1, wherein the transfer printing at least the plurality of electroluminescent layers on the plurality of protrudent portions comprises:

applying a continuous hole injection layer on the plurality of protrudent portions;

applying a continuous hole transport layer on the continuous hole injection layer;

transfer printing the plurality of electroluminescent layers on parts of the continuous hole transport layer that are on top surfaces of the plurality of protrudent portions;

applying a continuous electron transport layer on the plurality of electroluminescent layers; and applying a continuous electron injection layer on the continuous electron transport layer.

11. The method of claim 1, wherein three of the plurality of electroluminescent layers, that correspond to the same pixel unit, comprise a red light electroluminescent layer, a green light electroluminescent layer, and three blue light electroluminescent layers.

12. The method of claim 1, wherein the electrically connecting at least one second electrode to the plurality of organic light emitting layers comprises coating an electrically conductive film on a surface of a free standing support and then contacting the electrically conductive film with the plurality of organic light emitting layers.

13. A method of making organic light emitting diode array, the method comprising:

providing a base defining a plurality of convexities spaced from each other;

forming a plurality of first electrodes on the plurality of convexities, wherein the plurality of first electrodes are parallel with each other and extend along a first direction;

making a patterned second insulative layer among the plurality of convexities to cover first parts of the plurality of first electrodes between the plurality of convexities and expose second parts of the plurality of first electrodes on top surfaces of the plurality of convexities to form a plurality of protrudent portions, wherein the plurality of protrudent portions extend out of the patterned second insulative layer by extending through a plurality of openings of the patterned second insulative layer;

applying a plurality of organic light emitting layers on the plurality of protrudent portions comprising transfer printing at least a plurality of electroluminescent layers on the plurality of protrudent portions; and electrically connecting a plurality of second electrodes to the plurality of organic light emitting layers, wherein the plurality of second electrodes are parallel with each other and extend along a second direction different from the first direction.

14. The method of claim 13, wherein the plurality of convexities are strip-shaped, parallel with and spaced from each other, and the plurality of first electrodes are parallel with and spaced from each other, and corresponds to the plurality of convexities in a one-to-one manner.

15. The method of claim 14, wherein each of the plurality of first electrodes is located on top surface and side surface of one of the plurality of convexities, and extends to surfaces of the base that are between adjacent two of the plurality of convexities.

16. The method of claim 13, wherein the plurality of convexities are arranged to form a two-dimensional array, each of the plurality of first electrodes is located corresponding to one row of the plurality of convexities, and the plurality of organic light emitting layers is located corresponding to the plurality of convexities in a one-to-one manner.

17. The method of claim 13, wherein the transfer printing at least the plurality of electroluminescent layers on the plurality of protrudent portions comprises:

applying an organic electroluminescent film on a surface of a template;

contacting the plurality of protrudent portions with the organic electroluminescent film; and separating the plurality of protrudent portions from the template.

18. The method of claim 17, wherein the transfer printing at least the plurality of electroluminescent layers on the plurality of protrudent portions further comprises transfer printing at least one hole injection layer and at least one hole transport layer on the plurality of protrudent portions before contacting the plurality of protrudent portions with the organic electroluminescent film.

19. The method of claim 13, wherein the transfer printing at least the plurality of electroluminescent layers on the plurality of protrudent portions further comprises applying at least one electron transport layer on the plurality of electroluminescent layers and applying at least one electron injection layer on the at least one electron transport layer.

20. A method of making organic light emitting diode array, the method comprising:

providing a base defining a plurality of convexities spaced from each other;

forming a plurality of first electrodes on the plurality of convexities;

making a patterned second insulative layer among the plurality of convexities to cover first parts of the plurality of first electrodes between the plurality of convexities and expose second parts of the plurality of first electrodes on top surfaces of the plurality of convexities to form a plurality of protrudent portions, wherein the plurality of protrudent portions extend out of the patterned second insulative layer by extending through a plurality of openings of the patterned second insulative layer;

transfer printing a plurality of organic light emitting layers on the plurality of protrudent portions, wherein three of the plurality of organic light emitting layers, that correspond to the same pixel unit, comprise a red organic light emitting layer, a green light organic light emitting layer, and three blue light organic light emitting layers; and electrically connecting at least one second electrode to the plurality of organic light emitting layers.

* * * * *